United States Patent
Kim et al.

(10) Patent No.: US 10,978,384 B2
(45) Date of Patent: Apr. 13, 2021

(54) INTEGRATED CIRCUITS INCLUDING MULTI-LAYER CONDUCTING LINES

(71) Applicant: Samsung Electronics Co., Ltd., Suwon-si (KR)

(72) Inventors: Tae-hyung Kim, Yongin-si (KR); Chan-Ho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/519,725

(22) Filed: Jul. 23, 2019

(65) Prior Publication Data
US 2020/0075478 A1    Mar. 5, 2020

(30) Foreign Application Priority Data

Aug. 31, 2018 (KR) .................. 10-2018-0104019
Mar. 27, 2019 (KR) .................. 10-2019-0035178

(51) Int. Cl.
*H01L 23/522* (2006.01)
*G11C 5/06* (2006.01)
*H01L 25/065* (2006.01)
*G11C 5/02* (2006.01)
*G02B 6/43* (2006.01)

(52) U.S. Cl.
CPC ............ *H01L 23/5222* (2013.01); *G11C 5/02* (2013.01); *G11C 5/063* (2013.01); *H01L 25/0657* (2013.01); *G02B 6/43* (2013.01)

(58) Field of Classification Search
CPC . H01L 2225/06541; H01L 2225/06544; H01L 21/02063; H01L 21/76816; H01L 21/76877–76883; H01L 21/76897; H01L 21/486; H01L 23/5384; H01L 2221/1031; H01L 2221/1036; H01L 2223/6616–6622; H01L 2224/05085–05098; H01L 2224/8203–82047; H01L 23/5222; H01L 23/5226; H01L 25/0657
See application file for complete search history.

(56) References Cited

U.S. PATENT DOCUMENTS

| | | | |
|---|---|---|---|
| 5,341,014 A | 8/1994 | Fujii et al. | |
| 6,570,236 B2 | 5/2003 | Nakaya et al. | |
| 8,048,798 B2 | 11/2011 | Kidoh et al. | |
| 9,196,582 B2 | 11/2015 | Hsu et al. | |

(Continued)

FOREIGN PATENT DOCUMENTS

| | | |
|---|---|---|
| KR | 10-1997-0004817 B1 | 4/1997 |
| KR | 10-0195330 B1 | 6/1999 |

*Primary Examiner* — Thanh Y. Tran
(74) *Attorney, Agent, or Firm* — Harness, Dickey & Pierce, P.L.C.

(57) ABSTRACT

An integrated circuit includes a plurality of layers stacked in a first direction, a plurality of unit circuits at least partially overlapping each other in a second direction that is perpendicular to the first direction and configured to operate in parallel with one another, control circuitry configured to generate a control signal to control the plurality of unit circuits, and a multi-layer conducting line configured to transfer the control signal from the control circuitry to the plurality of unit circuits. The multi-layer conducting line may be integrally formed in a wiring layer and a via layer and extends in the second direction. The wiring layer and the via layer may be adjacent to each other.

22 Claims, 14 Drawing Sheets

(56) References Cited

U.S. PATENT DOCUMENTS

| | | |
|---|---|---|
| 9,450,023 B1 | 9/2016 | Konevecki et al. |
| 9,704,564 B2 | 7/2017 | Liaw |
| 9,761,602 B2 | 9/2017 | Oh et al. |
| 2017/0148812 A1 | 5/2017 | Hsu |
| 2018/0269152 A1* | 9/2018 | Sengupta ............ H01L 23/5283 |
| 2019/0035734 A1* | 1/2019 | Ho .................... H01L 23/53295 |

* cited by examiner

US 10,978,384 B2

INTEGRATED CIRCUITS INCLUDING MULTI-LAYER CONDUCTING LINES

CROSS-REFERENCE TO RELATED APPLICATIONS

This application claims the benefits of Korean Patent Application No. 10-2018-0104019, filed on Aug. 31, 2018, and Korean Patent Application No. 10-2019-0035178, filed on Mar. 27, 2019, in the Korean Intellectual Property Office, the disclosures of each of which are incorporated herein in their entirety by reference.

BACKGROUND

The inventive concepts relate to integrated circuits, and more particularly, to integrated circuits including multi-layered conducting lines.

As integrated circuits with high operating speeds have been demanded, a signal delay occurring in wires of integrated circuits has been considered a significant design factor. A wire electrically connecting two or more devices with each other in an integrated circuit may have an electrical resistance thereof (also referred to herein as simply a "resistance" of the wire), and the wire may generate a capacitance with a neighboring (e.g., adjacent) wire. A signal delay may occur due to the resistance and capacitance of the wires, and as the resistance and the capacitance of the wires increase, the signal delay occurring in the wires may also increase. Also, due to a miniaturization of semiconductor processes, sizes of patterns included in wires and distances among adjacent patterns may be reduced, and accordingly, a signal delay occurring in one or more of the wires may become worse, and moreover, an operating speed of an integrated circuit including the wires may be reduced.

SUMMARY

The inventive concepts provide multi-layer conducting lines configured to reduce a signal delay and integrated circuits of a high integration degree and including the multi-layer conducting lines.

According to some example embodiments of the inventive concepts, an integrated circuit may include a first wiring layer including a plurality of first patterns, a first via layer including a plurality of first vias, the first via layer adjacent to the first wiring layer in a first direction, and a multi-layer conducting line including a first portion and a second portion, the first portion extending in a second direction perpendicular to the first direction in the first wiring layer and the second portion extending in the second direction in the first via layer. The first portion and the second portion may be integrally formed with each other.

According to some example embodiments of the inventive concepts, an integrated circuit may include a first wiring layer including a plurality of first patterns, a first via layer including a plurality of first vias, the first via layer adjacent to the first wiring layer in a first direction, and a multi-layer conducting line including a first portion, a second portion, and a first barrier layer, the first portion extending in a second direction perpendicular to the first direction in the first wiring layer, the second portion extending in the second direction in the first via layer, and the first barrier layer extending in the second direction between the first portion and the second portion.

According to some example embodiments of the inventive concepts, an integrated circuit may include a plurality of layers stacked in a first direction, a plurality of unit circuits at least partially overlapping each other in a second direction that is perpendicular to the first direction and configured to operate in parallel with one another, control circuitry configured to generate a control signal to control the plurality of unit circuits, and a multi-layer conducting line configured to transfer the control signal from the control circuitry to the plurality of unit circuits. The multi-layer conducting line may be integrally formed in a wiring layer and a via layer and extends in the second direction. The wiring layer and the via layer may be adjacent to each other.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION OF EXAMPLE EMBODIMENTS

Figure 1:
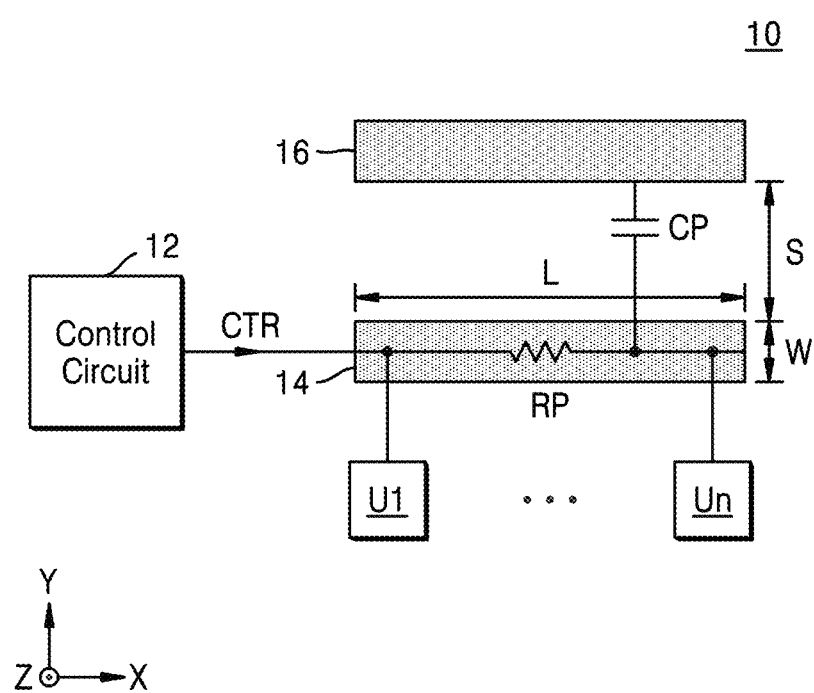
FIG. 1 is a diagram of an integrated circuit according to some example embodiments.

FIG. 1 is a diagram of an integrated circuit 10 according to some example embodiments. In detail, FIG. 1 is a block diagram of the integrated circuit 10, and additionally shows some conducting lines 14 and 16 included in a layout of the integrated circuit 10. A Z-axis direction as used herein is a direction in which a plurality of layers are stacked in a semiconductor process for manufacturing the integrated circuit 10, and may be referred to as a first direction or a vertical direction, and an X-axis direction and a Y-axis direction may be respectively referred to as a second direction and a third direction. An element disposed in the +Z-axis direction as compared with another element may be considered to be located on another element, and an element disposed in the −Z-axis direction as compared with another element may be considered to be located under another element. Also, among surfaces of an element, a surface exposed in the +Z-axis direction may be referred to as an upper surface, a surface exposed in the −Z-axis direction may be referred to as a lower surface, and a surface exposed in the X-axis direction or the Y-axis direction may be referred to as a side surface. Unless otherwise defined, a length of an element may denote a length in an extending direction, and a width of an element may denote a length in a direction perpendicular to the extending direction. Also, a height of an element may denote a length in the Z-axis direction. Accompanying drawings showing a layout may denote only some of layers for convenience of description.

The integrated circuit 10, also referred to herein as "integrated circuitry", may denote an arbitrary device manufactured through a semiconductor process. In some example embodiments, the integrated circuit 10 may be a memory device including a plurality of memory cells, a processor including at least one core, a sensor for sensing external signals, or a device including a plurality of functional blocks, e.g., a system-on-chip (SoC). As shown in FIG. 1, the integrated circuit 10 may include a control circuit 12 (also referred to herein as "control circuitry") and a plurality of unit circuits (also referred to herein as "unit circuitries") U1, . . . , Un (n is an integer greater than 1), and may additionally include a plurality of conducting lines 14 and 16. It will be understood that, as used herein, a conducting line (e.g., each conducting line of the plurality of conducting lines 14 and 16) may be referred to as a "wire" that is electrically conductive (e.g., is configured to conduct electricity therethrough between opposite ends thereof).

The plurality of unit circuits U1, . . . , Un may have the same structure as one another, and may be configured to operate in parallel with one another. As a non-limiting example, as described later with reference to FIG. 9, the plurality of unit circuits U1, . . . , Un may be memory cells storing data in a memory device (e.g., a plurality of memory cells each configured to store at least one bit of data), as described later with reference to FIG. 11, the plurality of unit circuits U1, . . . , Un may be pixels sensing light in an image sensor (e.g., a plurality of pixels each configured to sense incident light), and as described later with reference to FIG. 12, the plurality of unit circuits U1, . . . , Un may be pixels emitting light in a display apparatus (e.g., a plurality of pixels each configured to emit light). Parallel operations of the plurality of unit circuits U1, . . . , Un may be demanded to be performed simultaneously, and when there is a large difference between time points at which the parallel operations are performed, an operating speed of the integrated circuit 10 may be reduced, and further, a malfunction may be caused. As shown in FIG. 1, and with reference to at least FIG. 2, the plurality of unit circuits U1, . . . , Un may be disposed in the X-axis direction (e.g., the second direction as described below) such that the plurality of unit circuits U1, . . . , Un may be understood to at least partially overlap with each other in the X-axis direction.

The control circuit 12, which may be referred to herein as "control circuitry," may include processing circuitry such as hardware including logic circuits; a hardware/software combination such as a processor executing software; or a combination thereof. For example, the control circuit 12 more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The control circuit 12 may generate a control signal CTR for controlling the plurality of unit circuits U1, . . . , Un. In some example embodiments, the control circuit 12 may generate the control signal CTR having a variable voltage and/or current for controlling operations of the plurality of unit circuits U1, . . . , Un. As shown in FIG. 1, the plurality of unit circuits U1, . . . , Un may be disposed ("located") adjacent to one another, and the control circuit 12 may be disposed adjacent to a side of the plurality of unit circuits U1, . . . , Un. Also, the plurality of unit circuits U1, . . . , Un may be electrically connected to a first conducting line 14 that extends in the X-axis direction (or the second direction), and may receive the control signal CTR via the first conducting line 14. Due to the delay of the control signal CTR in the first conducting line 14, the control signal CTR generated by the control circuit 12 may firstly reach the first unit circuit U1 and may finally reach the n-th unit circuit Un. Accordingly, the parallel operations of the first to n-th unit circuits U1 and Un may be respectively performed at different time points.

As shown in FIG. 1, the delay of control signal CTR occurring in the first conducting line 14 may depend upon a resistance RP of the first conducting line 14 and a capacitance CP formed by the first conducting line 14 and the second conducting line 16 adjacent to the first conducting line 14. The resistance RP may be proportional to a length L of the first conducting line 14 and inversely proportional to a width W of the first conducting line 14, and the capacitance CP may be inversely proportional to a distance S between the first conducting line 14 and the second conducting line 16. Accordingly, in order to reduce the delay of the control signal CTR occurring in the first conducting line 14, the first conducting line 14 may be required to have a relatively less length L and a relatively greater width W, and the first conducting line 14 and the second conducting line 16 may be required to have a relatively greater distance S. However, reduction of the length L of the first conducting line 14 may be restricted due to the number and sizes of the plurality of unit circuits U1, . . . , Un, and an increase in the width W and the distance S may be restricted due to a spatial limitation of the integrated circuit 10.

As described below with reference to accompanying drawings, the first conducting line 14 transferring the control signal CTR to the plurality of unit circuits U1, . . . , Un may include multi-layer conducting lines, and accordingly, the first conducting line 14 may maintain or increase the distance S to the adjacent second conducting line 16 while having a lower resistance RP. Accordingly, the first conducting line 14 may provide reduced delay, and a difference between the time points at which the parallel operations of the first unit pixel U1 and the n-th unit pixel Un are performed may be greatly reduced. In addition, in some example embodiments, due to the reduced width W of the first conducting line 14, the second conducting line 16 may have an increased width, and accordingly, an operating speed and/or operating reliability of the integrated circuit 10 may be improved.

Figure 2:
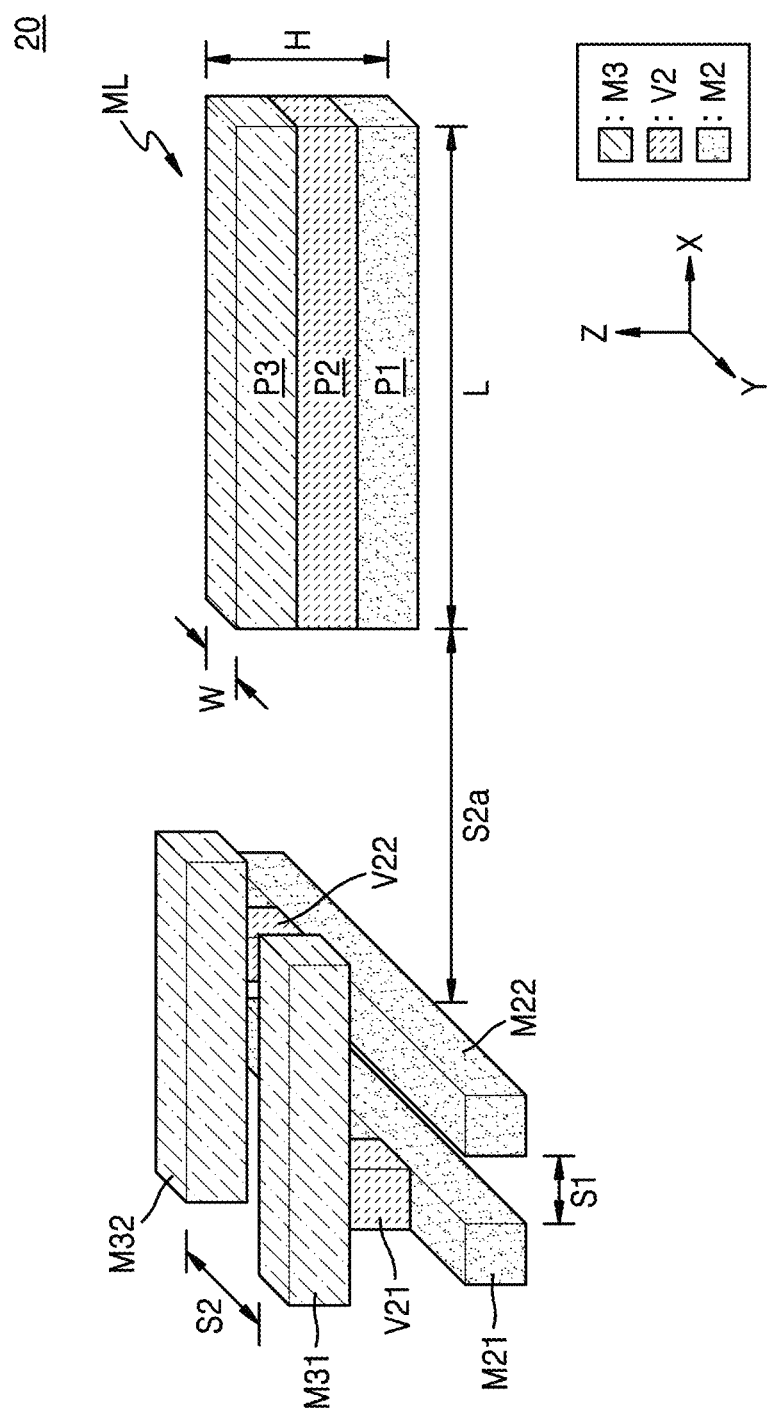
FIG. 2 is a diagram showing a layout of an integrated circuit according to some example embodiments.

FIG. 2 is a diagram showing a layout of an integrated circuit 20 according to some example embodiments. In detail, FIG. 2 partially shows a M2 layer, a V2 layer, and a M3 layer from among a plurality of layers included in a layout of the integrated circuit 20. As described above with reference to FIG. 1, the integrated circuit 20 of FIG. 2 may include multi-layered conducting lines ML for transferring a control signal to a plurality of unit circuits operating in parallel with one another. For convenience of description, FIG. 2 only shows one multi-layer conducting line ML and some other patterns included in the layout of the integrated circuit 20.

The integrated circuit 20 may include a plurality of wiring layers and a plurality of via layers in a plurality of layers stacked in the Z-axis direction (or the first direction). Accordingly, as shown in FIG. 2, the integrated circuit 20 may include a plurality of layers stacked in the Z-axis direction. The integrated circuit 20 may further include the plurality of unit circuits U1, . . . , Un shown in FIG. 1, where the plurality of unit circuits are disposed in the X-axis direction such that the plurality of unit circuits U1, . . . , Un may be understood to at least partially overlap with each other in the X-axis direction. The integrated circuit 20 may further include the control circuit 12 shown in FIG. 1 (also referred to herein as "control circuitry"), where the control circuit 12 is configured to generate a control signal to control the plurality of unit circuits U1, . . . , Un. In some example embodiments, the multi-layer conducting line ML is configured to transfer the control signal from the control circuit 12 to the plurality of unit circuit U1, . . . , Un. As further described below with reference to at least FIGS. 9-12, it will be understood that the multi-layer conducting line ML may be electrically connected to control electrodes of transistors included in the plurality of unit circuits U1, . . . , Un. As described further below, the multi-layer conducting line ML may be integrally formed in a wiring layer (e.g., M2 layer) and a via layer (e.g., V2 layer) and extends in the X-axis direction, where the wiring layer and the via layer are adjacent to each other. The wiring layer may include a plurality of patterns and the via layer may include a plurality of vias. In some example embodiments, as shown in FIG. 2, the M2 layer as a wiring layer (e.g., a first wiring layer) may include a first pattern M21 and a second pattern M22 extending in the Y-axis direction and the M3 layer as a wiring layer (e.g., a second wiring layer) may include a third pattern M31 and a fourth pattern M32 extending in the X-axis direction. Also, a first via V21 and a second via V22 may be provided in the V2 layer, that is, the via layer. As shown, the V2 layer (via layer) may be adjacent to the M2 layer (first wiring layer) in the Z-axis direction (or a first direction). As shown, the M3 layer (second wiring layer) may be adjacent to the V2 layer (via layer) in the Z-axis direction (or a first direction). In addition, the first via V21 may be connected to the first pattern M21 and a third pattern M31, and the second via V22 may be connected to the second pattern M22 and a fourth pattern M32. The patterns and the vias may be spaced from one another (e.g., isolated from direct contact with each other) by a minimum distance or greater, wherein the minimum distance is determined based on the semiconductor process for manufacturing the integrated circuit 20. In some example embodiments, the first and second patterns M21 and M22 may be separate from each other (e.g., isolated from direct contact with each other) by at least a first distance S1. In some example embodiments, as shown in FIG. 2, a first distance S1 between the first pattern M21 and the second pattern M22 in the X-axis direction in the M2 layer and a second distance S2 between the third pattern M31 and the fourth pattern M32 in the Y-axis direction in the M3 layer may be equal to or greater than the minimum distance determined according to the semiconductor process.

The multi-layer conducting line ML may extend in the X-axis direction (or the second direction perpendicular to the Z-axis direction) through two or more adjacent layers. In some example embodiments, the multi-layer conducting line ML may be isolated from direct contact with the first and second patterns M21 and M22 of the M2 layer by a distance S2a that is greater than the first distance S1. In some example embodiments, as shown in FIG. 2, the multi-layer conducting line ML may include a first portion P1 extending in the X-axis direction in the M2 layer, a second portion P2 extending in the X-axis direction in the V2 layer, and a third portion P3 extending in the X-axis direction in the M3 layer. Although the multi-layer conducting line ML extend in the X-axis direction in three successive layers in FIG. 2, as described later with reference to FIGS. 3A and 3B, etc., the multi-layer conducting line ML may extend in the X-axis direction in two adjacent layers (e.g., layers M2/V2 or layers V2/M3), or as described later with reference to FIGS. 8A and 8B, the multi-layer conducting line ML may extend in the X-axis direction in four or more successive layers. Accordingly, the multi-layer conducting line ML may have a reduced resistance, as compared with a structure extending in a single layer and a structure in which extensions are connected by vias in two wiring layers. As shown in FIG. 2, the multi-layer conducting line ML may have a length L in the X-axis direction, a width W in the Y-axis direction, and a height H in the Z-axis direction. As shown in FIG. 2, the third portion P3 may extend in the X-axis direction (or second direction) by a length L that is equal to a length L of the first portion P1. As shown in FIG. 2, the second portion P2 may have a length L that is equal to a length L of the first portion P1.

Heights of the layers M2, V2, and M3 shown in FIG. 2, that is, the lengths in the Z-axis direction, are examples, and may be different from those examples of FIG. 2. Also, one or more embodiments will be described based on the layers M2, V2, and M3 hereinafter, but it will be understood that multi-layer conducting lines according to some example embodiments may be also included in other wiring layers and via layers.

Figure 3A:
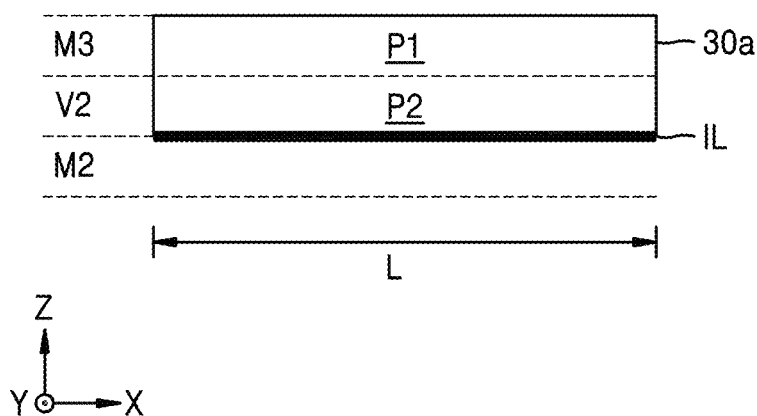
FIGS. 3A and 3B are diagrams showing examples of multi-layer conducting lines according to some example embodiments.
Figure 3B:
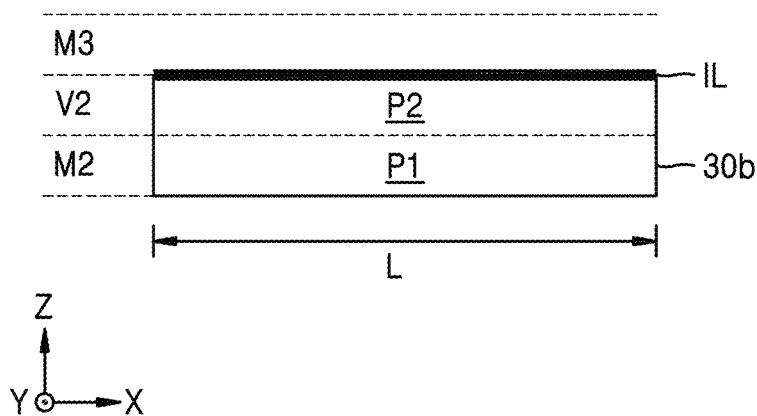

FIGS. 3A and 3B are diagrams showing examples of multi-layer conducting lines 30a and 30b according to some example embodiments. In detail, FIGS. 3A and 3B show the multi-layer conducting lines 30a and 30b, respectively, which are integrally formed in two adjacent layers and have a length L in the X-axis direction. Hereinafter, redundant descriptions about FIGS. 3A and 3B will be omitted.

Referring to FIG. 3A, the multi-layer conducting line 30a may include the first portion P1 extending in the X-axis direction in the M3 layer and the second portion P2 extending in the X-axis direction in the V2 layer, and the first portion P1 and the second portion P2 may be integrally formed with each other. Accordingly, it will be understood that the multi-layer conducting line 30a may be integrally formed in a wiring layer (e.g., M3 layer) and a via layer (e.g., V2 layer) and extends in the X-axis direction, where the wiring layer and the via layer are adjacent to each other. In the specification herein, 'elements formed integrally with each other' may denote that the elements are continuously formed by using a same material, and the elements that are integrally formed with each other may be denoted by a single outline in the drawings. In some example embodiments, as described later with reference to FIGS. 4, 5A, and 5B, the first portion P1 in the M3 layer and the second portion P2 in the V2 layer that are surrounded by a single outline in FIG. 3A may include the same material, e.g., metal such as aluminum (Al), copper (Cu), etc., and a boundary between the first portion P1 and the second portion P2 (or boundary between the M3 layer and the V2 layer) may also include the same material. In some example embodiments, elements that are integrally formed with each other may comprise a single, uniform part instead of separate elements coupled together. In some example embodiments, unlike the example of FIG. 3A, portions that are not formed integrally with each other may include a different material (e.g., an insulator, a barrier wall, etc.) disposed therebetween. In the specification, it will be described that the multi-layer conducting line includes the metal such as Al or Cu, but the multi-layer conducting line may include a conductive material different from the metal.

Due to the first portion P1 and the second portion P2 that are provided integrally with each other, the multi-layer conducting line 30a may have a reduced resistance. As described above with reference to FIG. 1, since it is restricted to increase the width of the conducting line due to the spatial limitation, it may be considered to use the conducting line including patterns that extend in the same direction in two or more wiring layers and connected to one another through vias unlike the multi-layer conducting line 30a of FIG. 3A, in order to reduce the resistance of the conducting line. However, in the above conducting line, the reduction of the resistance of the conducting line may be restricted due to a resistance provided by the via in the Z-axis direction and a resistance of a barrier layer between patterns of the wiring layer and vias, and moreover, the reduction of the resistance may be further diminished as the semiconductor process becomes miniaturized. In some example embodiments, as shown in FIG. 3A, the multi-layer conducting line 30a formed integrally throughout two or more adjacent layers may be free from the influence of the resistance of the via and the resistance of the barrier layer, and may also have a reduced resistance even with the miniaturized semiconductor process.

As shown in FIG. 3A, an interlayer insulator IL may be disposed on a lower surface of the multi-layer conducting line 30a and thus may be between the multi-layer conducting line 30a and the M2 layer. The interlayer insulator IL may insulate the multi-layer conducting line 30a (or the second portion P2) from the other patterns formed in the M2 layer. As described above with reference to FIG. 2, the via layer such as the V2 layer may include the vias for connecting the patterns of adjacent wiring layers (that is, the M2 layer and the M3 layer) to one another, and thus, the interlayer insulator IL may be disposed to insulate the second portion P2 extending in the X-axis direction in the V2 layer from the patterns in the M2 layer that is adjacent to the V2 layer, unlike the vias formed in the via layer. In some example embodiments, the interlayer insulator IL may be referred to as an interlayer insulator film, an interlayer dielectric, etc.

Referring to FIG. 3B, the multi-layer conducting line 30b may include the first portion P1 extending in the X-axis direction in the M2 layer and the second portion P2 extending in the X-axis direction in the V2 layer, and the first portion P1 and the second portion P2 may be integrally formed with each other. In some example embodiments, the first portion P1 in the M2 layer and the second portion P2 in the V2 layer included within the single outline of FIG. 3B may include the same material, e.g., metal such as Cu, and a boundary between the first portion P1 and the second portion P2 (or boundary between the M2 layer and the V2 layer) may also include the same metal.

As shown in FIG. 3B, an interlayer insulator IL may be disposed on an upper surface of the multi-layer conducting line 30b and thus may be between the multi-layer conducting line 30b and the M3 layer. As described above, unlike the vias for connecting the patterns in the adjacent M2 layer and the M3 layer to one another, the interlayer insulator IL may be disposed to insulate the second portion P2 extending in the X-axis direction in the V2 layer from the patterns in the M3 layer that is adjacent to the V2 layer. Accordingly, the patterns disposed in the M3 layer on the multi-layer conducting line 30b may be insulated from the multi-layer conducting line 30b.

Figure 4:
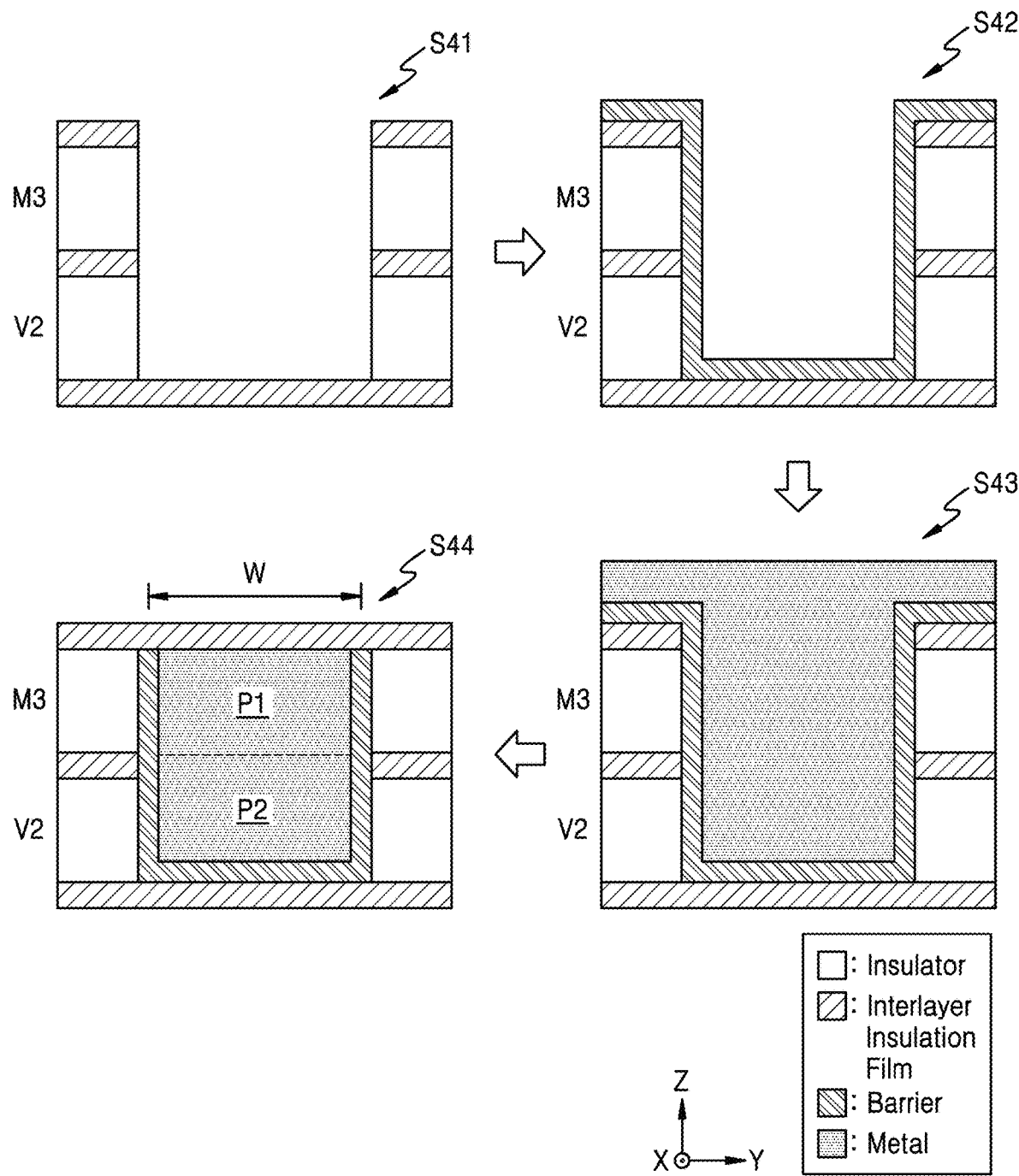
FIG. 4 is a diagram illustrating processes of forming multi-layer conducting line according to some example embodiments.

FIG. 4 is a diagram illustrating processes of forming the multi-layer conducting line 30a according to some example embodiments. In detail, FIG. 4 sequentially shows cross-sections taken along a plane perpendicular to a direction in which the multi-layer conducting line 30a extends, that is, the X-axis direction, according to processes of forming the multi-layer conducting line 30a of FIG. 3A. Hereinafter, FIG. 4 will be described with reference to FIG. 3A.

In some example embodiments, the multi-layer conducting line 30a may be formed by a damascene process. The damascene process may denote a technique that finishes forming patterns by making a space through an etching, filling the space with a material for forming the patterns, and then polishing the patterns. In particular, a technique of etching simultaneously two adjacent layers, e.g., the via layer and the wiring layer, filling the space with metal, and polishing the space to form the vias and patterns at the same time may be referred to as a dual damascene process.

Referring to FIG. 4, in operation S41, an operation of partially etching the V2 layer and the M3 layer may be performed. In some example embodiments, the V2 layer and the M3 layer may be partially etched according to the length L and the width W of the multi-layer conducting line 30a. Next, in operation S42, an operation of forming a barrier layer may be performed. The barrier layer may be configured to reduce or prevent the metal forming the multi-layer conducting line 30a, oxygen, or moisture from diffusing to outside, and accordingly, the interlayer insulator between the V2 layer and the M3 layer, as well as the insulator included in the V2 layer and the M3 layer, may be protected. In some example embodiments, the barrier layer may include a conductive material, in some example embodiments, Ti/TiN, Ta/TaN, etc., and may be formed by a physical vapor deposition (PVD) method. Also, in some example embodiments, a seed layer for filling the material may be formed after forming the barrier layer, and herein, the seed layer may be considered to be included in the barrier layer. In some example embodiments, when the multi-layer conducting line 30a includes Cu, a seed layer for filling Cu in an electroplating method may be formed by the PVD method.

In operation S43, an operation of filling metal may be performed. In some example embodiments, as described above, the seed layer may be disposed on the barrier layer, and the operation of filling metal material in the electroplating method may be performed. In operation S44, a polishing operation may be performed. In some example embodiments, as shown in operation S43 of FIG. 4, the metal material may be formed on the M3 layer in operation S43, the barrier layer, as well as the metal on the M3 layer, may be removed by the polishing operation such as chemical mechanical polishing (CMP), and then, an interlayer insulating film may be formed. Accordingly, as shown in operation S44 of FIG. 4, the multi-layer conducting line 30a may include the first portion P1 extending in the X-axis direction in the M3 layer and the second portion P2 extending in the X-axis direction in the V2 layer, and the first portion P1 and the second portion P2 may be integrally formed with each other. In some example embodiments, as shown in FIG. 4, the first portion P1 and the second portion P2 may have substantially the same width W, and as described later with reference to FIGS. 5A and 5B, the first portion P1 and the second portion P2 may have different widths from each other. As shown in FIG. 4, the barrier layer may be at least partially in a surface of the multi-layer conducting line when the multi-layer conducting line is formed.

Figure 5A:
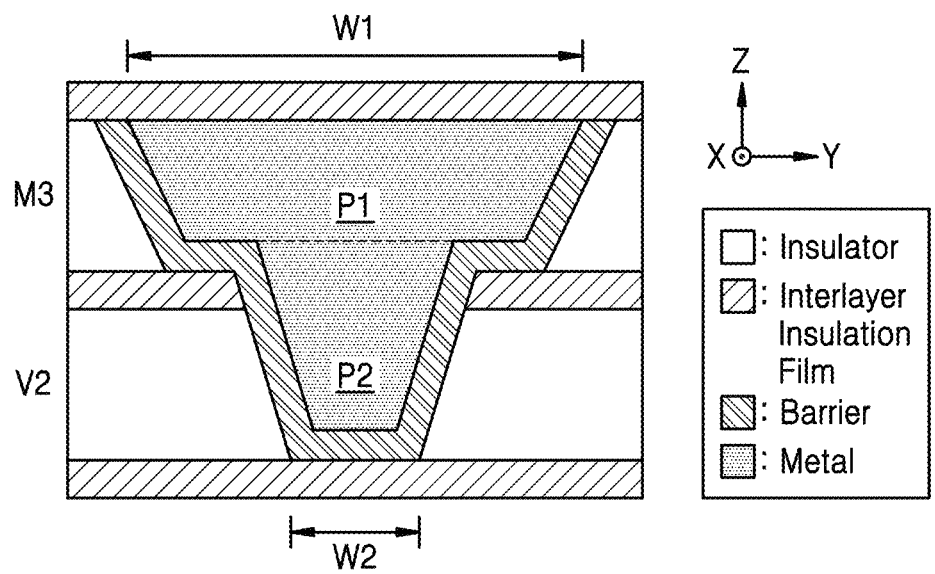
FIGS. 5A and 5B are diagrams showing examples of multi-layer conducting lines according to some example embodiments.
Figure 5B:
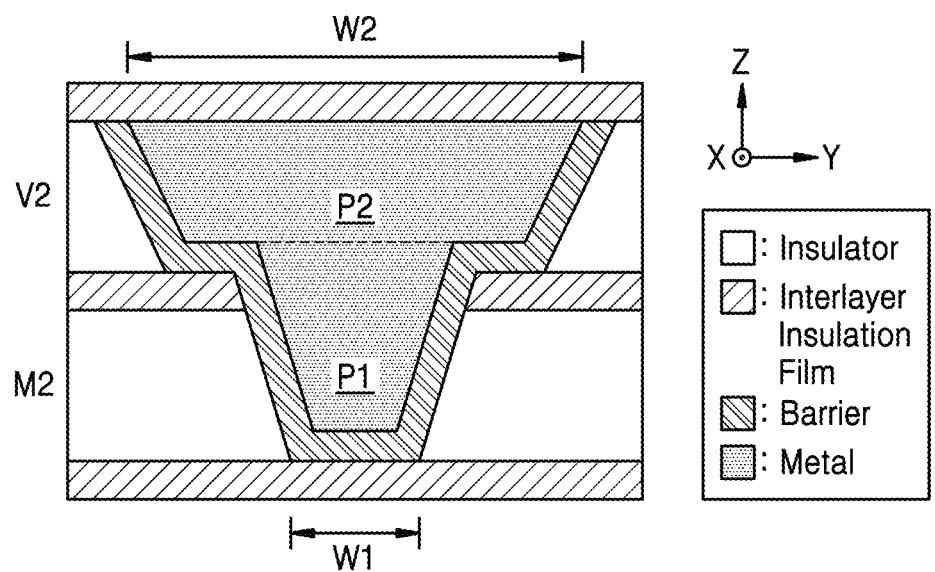

FIGS. 5A and 5B are diagrams showing examples of multi-layer conducting lines according to some example embodiments. In detail, FIG. 5A shows an example of a cross-section of the multi-layer conducting line 30a taken along a plane perpendicular to the X-axis direction, in which the multi-layer conducting line 30a of FIG. 3A extends, and FIG. 5B shows an example of a cross-section of the multi-layer conducting line 30b taken along a plane perpendicular to the X-axis direction, in which the multi-layer conducting line 30b of FIG. 3B extends. Hereinafter, redundant descriptions about FIGS. 5A and 5B will be omitted.

Referring to FIG. 5A, the multi-layer conducting line 30a may include the first portion P1 extending in the X-axis direction in the M3 layer and the second portion P2 extending in the X-axis direction in the V2 layer, and the first portion P1 and the second portion P2 may have different widths, that is, lengths in the Y-axis direction, from each other. In some example embodiments, as shown in FIG. 5A, the first portion P1, that is, an upper portion of the multi-layer conducting line 30a, has a first width W1, and the second portion P2, that is, a lower portion of the multi-layer conducting line 30a, may have a second width W2. The second width W2 may be less than the first width W1. Also, in some example embodiments, side surfaces of the first portion P1 and the second portion P2 may be inclined surfaces that are not in parallel with the Z-axis direction, as shown in FIG. 5A.

Similarly, referring to FIG. 5B, the multi-layer conducting line 30b may include the first portion P1 extending in the X-axis direction in the M2 layer and the second portion P2 extending in the X-axis direction in the V2 layer, and the first portion P1 and the second portion P2 may have different widths, that is, lengths in the Y-axis direction, from each other. In some example embodiments, as shown in FIG. 5B, the second portion P2, that is, an upper portion of the multi-layer conducting line 30b, may have the second width W2, and the first portion P1, that is, a lower portion of the multi-layer conducting line 30b, may have the first width W1. The first width W1 may be less than the second width W2. Also, in some example embodiments, side surfaces of the first portion P1 and the second portion P2 may be inclined surfaces that are not in parallel with the Z-axis direction, as shown in FIG. 5B.

FIGS. 6A, 6B, 6C, 6D, and 6E are diagrams showing examples of multi-layer conducting lines 60a to 60e according to some example embodiments. In detail, FIGS. 6A to 6E show the multi-layer conducting lines 60a, 60b, 60c, 60d, and 60e each including portions that have a length L in the X-axis direction and extend together in the X-axis direction respectively in three successive layers. It would be appreciated from FIGS. 6A to 6E that the multi-layer conducting lines as shown in FIGS. 6A to 6E having various structures may be formed according to the semiconductor process, and multi-layer conducting lines including the portions extending together in three successive layers in a different structure from those of FIGS. 6A to 6E may be implemented. Hereinafter, redundant descriptions about FIGS. 6A to 6E will be omitted.

Figure 6A:
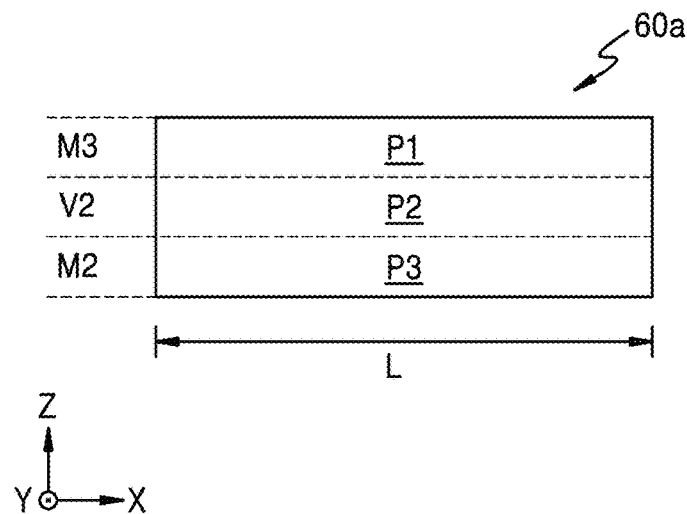
FIGS. 6A, 6B, 6C, 6D, and 6E are diagrams showing examples of multi-layer conducting lines according to some example embodiments.

Referring to FIG. 6A, the multi-layer conducting line 60a may include the first portion P1 extending in the X-axis direction in the M3 layer, the second portion P2 extending in the X-axis direction in the V2 layer, and a third portion P3 extending in the X-axis direction in the M2 layer. The first portion P1, the second portion P2, and the third portion P3 may be integrally formed with one another. As described above with reference to FIG. 3A, the first portion P1, the second portion P2, and the third portion P3 formed integrally with one another may include the same material, e.g., metal, and boundaries among the first portion P1, the second portion P2, and the third portion P3 may include the same metal material. In some example embodiments, the multi-layer conducting line 60a may be formed by the damascene process, as described above with reference to FIG. 4.

Figure 6B:
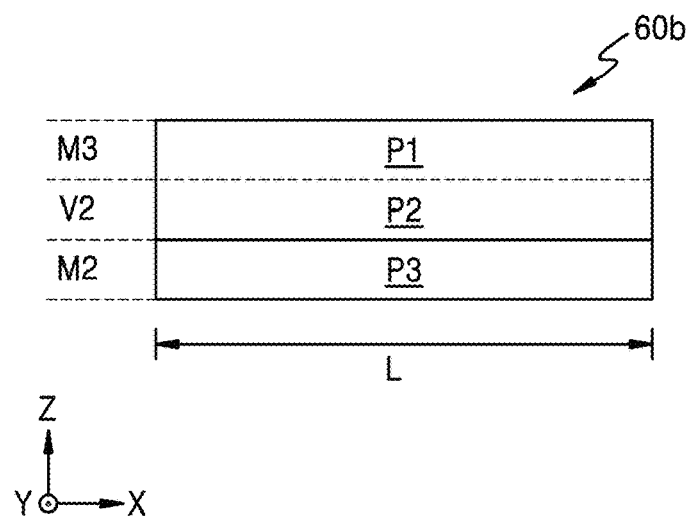

Referring to FIG. 6B, the multi-layer conducting line 60b may include the first portion P1 extending in the X-axis direction in the M3 layer, the second portion P2 extending in the X-axis direction in the V2 layer, and a third portion P3 extending in the X-axis direction in the M2 layer. The first portion P1 and the second portion P2 may be integrally formed with each another. That is, as shown in FIG. 6B, the first portion P1 and the second portion P2 on an upper portion of the multi-layer conducting line 60b within a single outline may be formed integrally with each other, and the third portion P3 within another single outline on a lower portion of the multi-layer conducting line 60b may not be formed integrally with the first portion P1 and the second portion P2. In some example embodiments, a different material, e.g., a barrier layer, may be disposed between the second portion P2 and the third portion P3 in the multi-layer conducting line 60b. In some example embodiments, as compared with a case, in which the first portion P1 in the M3 layer and the third portion P3 in the M2 layer are connected to each other via at least one via in the V2 layer instead of the second portion P2 in the V2 layer extending in the X-axis direction unlike the example of FIG. 6B, the multi-layer conducting line 60b of FIG. 6B may have a reduced resistance due to a barrier layer omitted between the V2 layer and the M3 layer, and due to the second portion P2 extending in the X-axis direction.

Figure 6C:
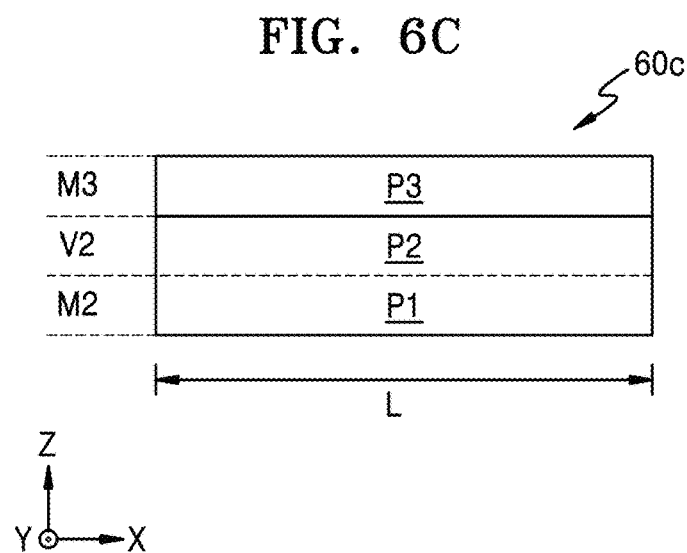

Referring to FIG. 6C, the multi-layer conducting line 60c may include the first portion P1 extending in the X-axis direction in the M2 layer, the second portion P2 extending in the X-axis direction in the V2 layer, and a third portion P3 extending in the X-axis direction in the M3 layer. The first portion P1 and the second portion P2 may be integrally formed with each another. That is, as shown in FIG. 6C, the first portion P1 and the second portion P2 on a lower portion of the multi-layer conducting line 60c within a single outline may be formed integrally with each other, and the third portion P3 within another single outline on an upper portion of the multi-layer conducting line 60c may not be formed integrally with the first portion P1 and the second portion P2. In some example embodiments, a different material, e.g., a barrier layer, may be disposed between the second portion P2 and the third portion P3 in the multi-layer conducting line 60c. In some example embodiments, as compared with a case, in which the first portion P1 in the M2 layer and the third portion P3 in the M3 layer are connected to each other through at least one via in the V2 layer instead of the second portion P2 in the V2 layer extending in the X-axis direction unlike the example of FIG. 6C, the multi-layer conducting line 60c of FIG. 6C may have a reduced resistance due to a barrier layer omitted between the V2 layer and the M2 layer, and due to the second portion P2 extending in the X-axis direction.

Figure 6D:
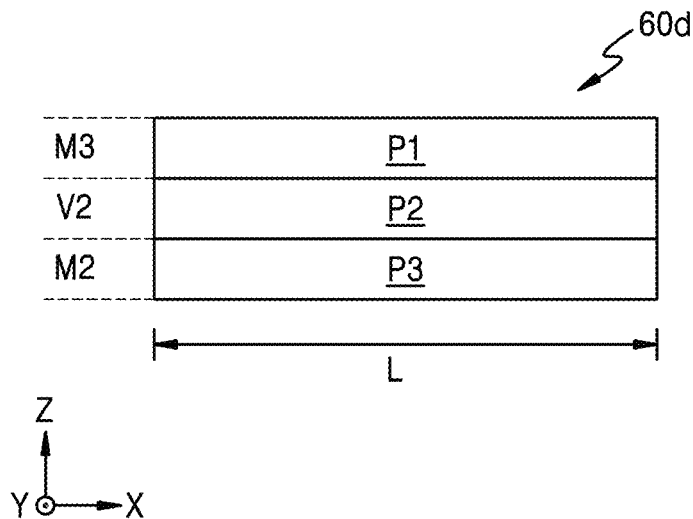

Referring to FIG. 6D, the multi-layer conducting line 60d may include the first portion P1 extending in the X-axis direction in the M3 layer, the second portion P2 extending in the X-axis direction in the V2 layer, and a third portion P3 extending in the X-axis direction in the M2 layer. The first portion P1, the second portion P2, and the third portion P3 may be separately formed from one another. That is, as shown in FIG. 6D, the first portion P1, the second portion P2, and the third portion P3 that are included respectively by a single outline in the multi-layer conducting line 60d may not be formed integrally with one another. Accordingly, a different material such as a barrier layer may be disposed between the first portion P1 and the second portion P2 of the multi-layer conducting line 60d and may extend in the X-axis direction therebetween, and a different material such as a barrier layer may be also disposed between the second portion P2 and the third portion P3 and may extend in the X-axis direction therebetween. The barrier layer between the second portion P2 and the third portion P3 may be a separate barrier layer from the barrier layer between the first portion P1 and the second portion P2, or the two barrier layers may be part of a single, uniform layer. In some example embodiments, as compared with a case, in which the first portion P1 in the M3 layer and the third portion P3 in the M2 layer are connected to each other through at least one via in the V2 layer instead of the second portion P2 in the V2 layer extending in the X-axis direction unlike the example of FIG. 6D, the multi-layer conducting line 60d of FIG. 6D may have a reduced resistance due to the second portion P2 extending in the X-axis direction. The barrier layer between the second portion P2 and the third portion P3 may be configured to reduce or prevent a material included in the third portion P3 and/or a material included in the second portion P2 from diffusing when the third portion P3 and/or the second portion P2 is formed. The barrier layer between the first portion P1 and the second portion P2 may be configured to reduce or prevent a material included in the first portion P1 and/or a material included in the second portion P2 from diffusing when the first portion P1 and/or the second portion P2 is formed.

Figure 6E:
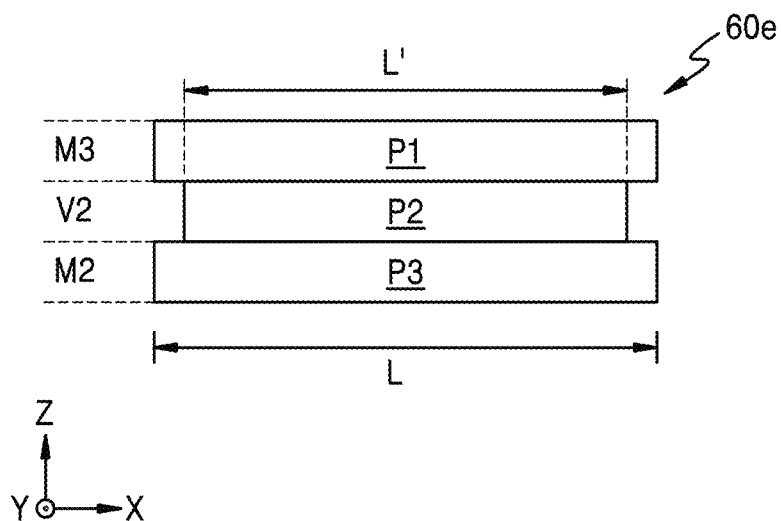

Referring to FIG. 6E, the multi-layer conducting line 60e may include the first portion P1 extending in the X-axis direction in the M3 layer, the second portion P2 extending in the X-axis direction in the V2 layer, and the third portion P3 extending in the X-axis direction in the M2 layer. Similarly to the multi-layer conducting line 60d of FIG. 6D, the first portion P1, the second portion P2, and the third portion P3 of FIG. 6E may be separately formed from each other, and at least two of the first portion P1, the second portion P2, and the third portion P3 may have different lengths from each other. In some example embodiments, as shown in FIG. 6E, the first portion P1 of the M3 layer and the third portion P3 of the M2 layer may have the length L that is the same as that of the multi-layer conducting line 60e, whereas the second portion P2 of the V2 layer may have a length L' that is less than the length L of the multi-layer conducting line 60e.

Figure 7A:
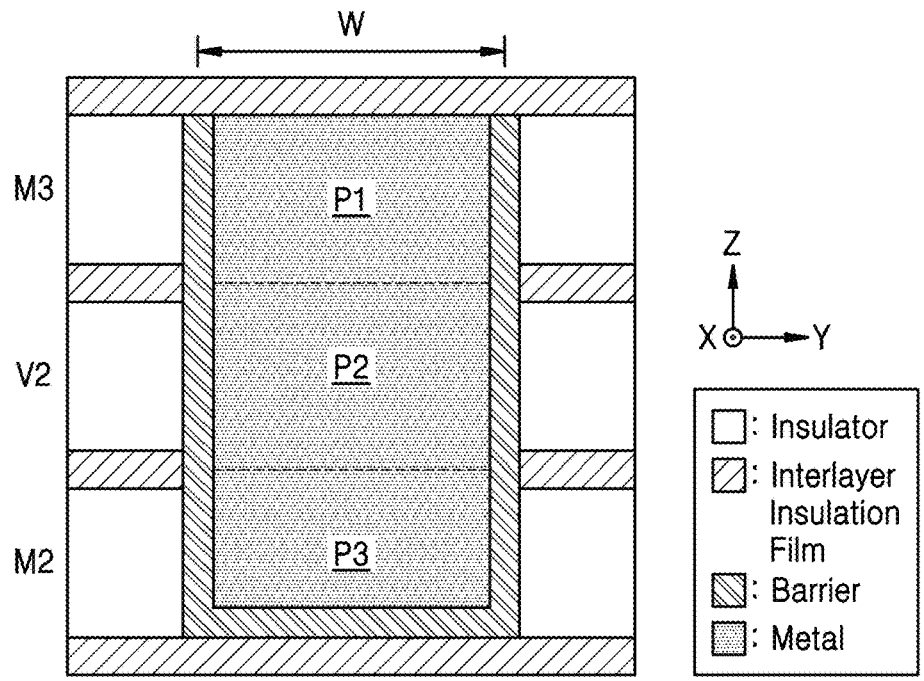
FIGS. 7A and 7B are diagrams showing examples of multi-layer conducting lines according to some example embodiments.
Figure 7B:
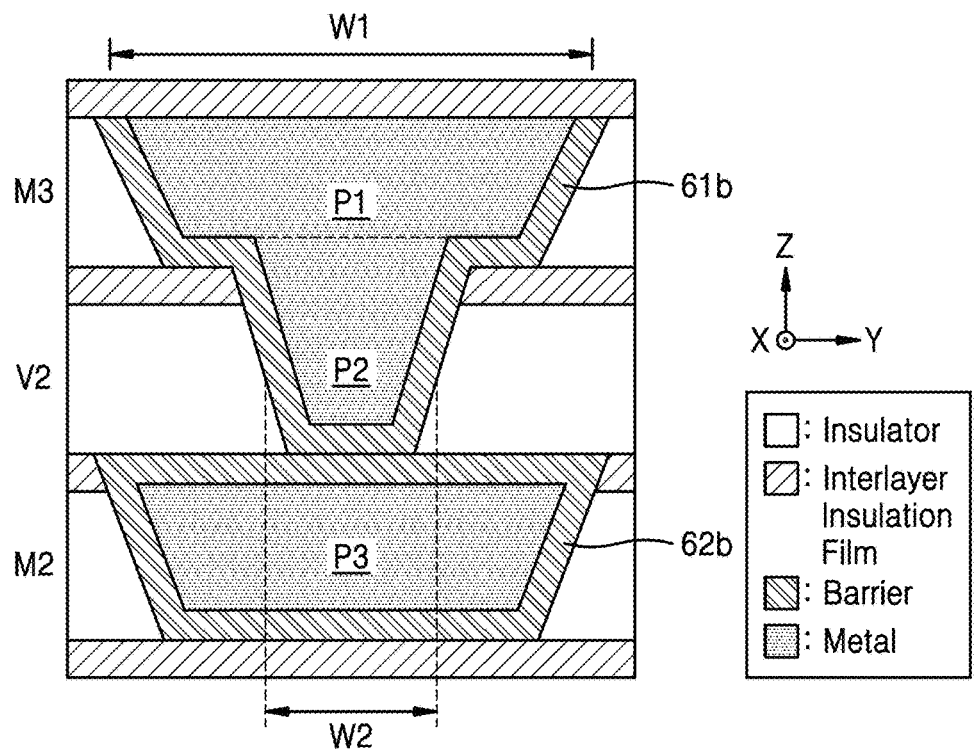

FIGS. 7A and 7B are diagrams showing examples of the multi-layer conducting lines 60a and 60b according to some example embodiments. In detail, FIG. 7A shows an example of a cross-section taken along a plane perpendicular to the X-axis direction in which the multi-layer conducting line 60a of FIG. 6A extends, and FIG. 7B shows an example of a cross-section taken along a plane perpendicular to the X-axis direction in which the multi-layer conducting line 60b of FIG. 6B extends. Hereinafter, redundant descriptions about FIGS. 7A and 7B will be omitted.

Referring to FIG. 7A, the multi-layer conducting line 60a may include the first portion P1 extending in the X-axis direction in the M3 layer, the second portion P2 extending in the X-axis direction in the V2 layer, and the third portion P3 extending in the X-axis direction in the M2 layer. As described above with reference to FIG. 6A, the first portion P1, the second portion P2, and the third portion P3 of the multi-layer conducting line 60a may be integrally formed with one another. Accordingly, the first portion P1, the second portion P2, and the third portion P3 in the multi-layer conducting line 60a may include the same material, e.g., metal, and boundaries among the first portion P1, the second portion P2, and the third portion P3 may include the same metal. In some example embodiments, the first portion P1, the second portion P2, and the third portion P3 of the multi-layer conducting line 60a may have substantially the same widths W as shown in FIG. 7A.

Referring to FIG. 7B, the multi-layer conducting line 60b may include the first portion P1 extending in the X-axis direction in the M3 layer, the second portion P2 extending in the X-axis direction in the V2 layer, and the third portion P3 extending in the X-axis direction in the M2 layer. As described above with reference to FIG. 6B, the first portion P1 and the second portion P2 may be integrally formed with each other, and the third portion P3 may not be integrally formed with the first portion P1 and the second portion P2. Accordingly, as shown in FIG. 7B, the boundary between the first portion P1 and the second portion P2 in the upper portion of the multi-layer conducting line 60b may include the same metal as those of the first and second portions P1 and P2, and on the contrary, a barrier layer may be disposed on the boundary between the second portion P2 and the third portion P3 in the lower portion of the multi-layer conducting line 60b. Accordingly, as shown in FIG. 7B, a multi-layer conducting line 60b may include a barrier layer 61b and/or 62b between the first portion P1 and the third portion P3. In some example embodiments, the barrier layer 61b and/or 62b, which may each at least partially extend in the X-axis direction (or second direction) between the second portion P2 and the third portion P3, may be configured to reduce or prevent a material included in the third portion P3 and/or a material included in the second portion P2 from diffusing when the third portion P3 and/or the second portion P2 is formed.

In some example embodiments, the first portion P1, the second portion P2, and the third portion P3 of the multi-layer conducting line 60b may have different widths from one another. In some example embodiments, as shown in FIG. 7B, the first portion P1 of the M3 layer and the third portion P3 of the M2 layer may approximately have the first width W1, and the second portion P2 of the V2 layer may have the second width W2. The second width W2 may be less than the first width W1. Lengths of the portions included in the multi-layer conducting line may be determined according to the semiconductor process.

Figure 8A:
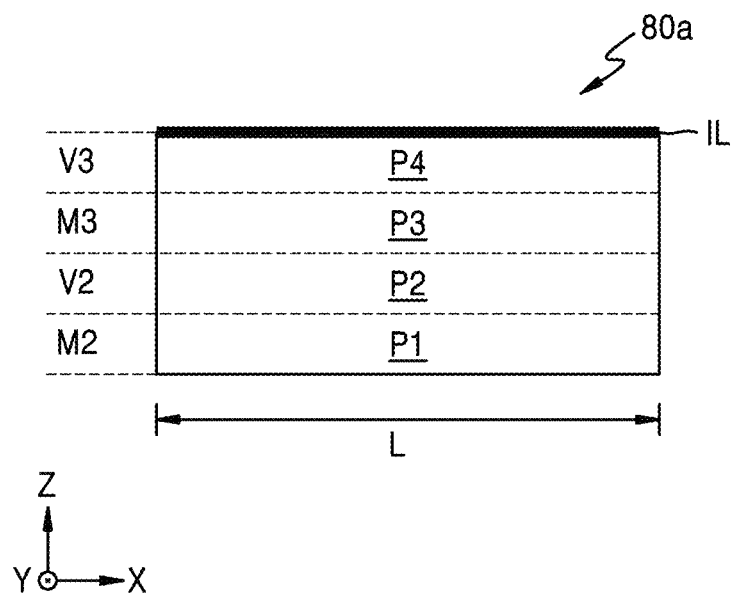
FIGS. 8A and 8B are diagrams showing examples of multi-layer conducting lines according to some example embodiments.
Figure 8B:
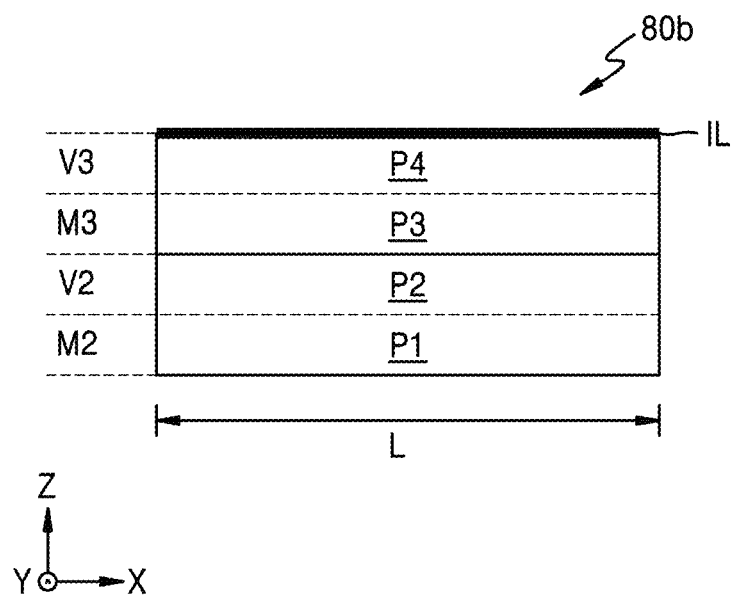

FIGS. 8A and 8B are diagrams showing examples of multi-layer conducting lines 80a and 80b according to some example embodiments. In detail, FIGS. 8A and 8B show the multi-layer conducting lines 80a and 80b each including portions that have a length L in the X-axis direction and extend together in the X-axis direction respectively in four successive layers. It would be appreciated from FIGS. 8A and 8B that the multi-layer conducting lines as shown in FIGS. 8A and 8B having the structures may be formed according to the semiconductor process, and multi-layer conducting lines including the portions extending together in three successive four or more layers in a different structure from those of FIGS. 8A and 8B may be implemented. Hereinafter, redundant descriptions about FIGS. 8A and 8B will be omitted.

Referring generally to both FIGS. 8A and 8B, an integrated circuit (e.g., the integrated circuit as shown in FIG. 2) may further include a V3 layer (e.g., a second via layer) that includes a plurality of second vias, where V3 layer is adjacent to the M3 layer (or second wiring layer) in the Z-axis direction (or first direction), such that the M3 layer is between the V3 layer and the V2 layer. Referring to FIG. 8A, the multi-layer conducting line 80a may include the first portion P1 extending in the X-axis direction in the M2 layer, the second portion P2 extending in the X-axis direction in the V2 layer, the third portion P3 extending in the X-axis direction in the M3 layer, and the fourth portion P4 extending in the X-axis direction (or second direction) in the V3 layer. As shown in FIG. 8A, the first portion P1, the second portion P2, the third portion P3, and the fourth portion P4 may be integrally formed with one another, and in some example embodiments, the multi-layer conducting line 80a may be formed by the damascene process. As shown in FIG. 8A, an interlayer insulator IL may be disposed on an upper surface of the multi-layer conducting line 80a, and accordingly, the multi-layer conducting line 80a may be insulated from patterns formed in a wiring layer above the V3 layer.

Referring to FIG. 8B, the multi-layer conducting line 80b may include the first portion P1 extending in the X-axis direction in the M2 layer, the second portion P2 extending in the X-axis direction in the V2 layer, the third portion P3 extending in the X-axis direction in the M3 layer, and the fourth portion P4 extending in the X-axis direction in a V3 layer. As shown in FIG. 8B, the first portion P1 and the second portion P2 may be integrally formed with each other in the lower portion of the multi-layer conducting line 80b, and the third portion P3 and the fourth portion P4 may be integrally formed with each other in the upper portion of the multi-layer conducting line 80b. Accordingly, a barrier layer may be disposed between the second portion P2 of the V2 layer and the third portion P3 of the M3 layer. Similarly to the multi-layer conducting line 80a of FIG. 8A, an interlayer insulator IL may be disposed on an upper surface of the multi-layer conducting line 80b of FIG. 8B.

Figure 9:
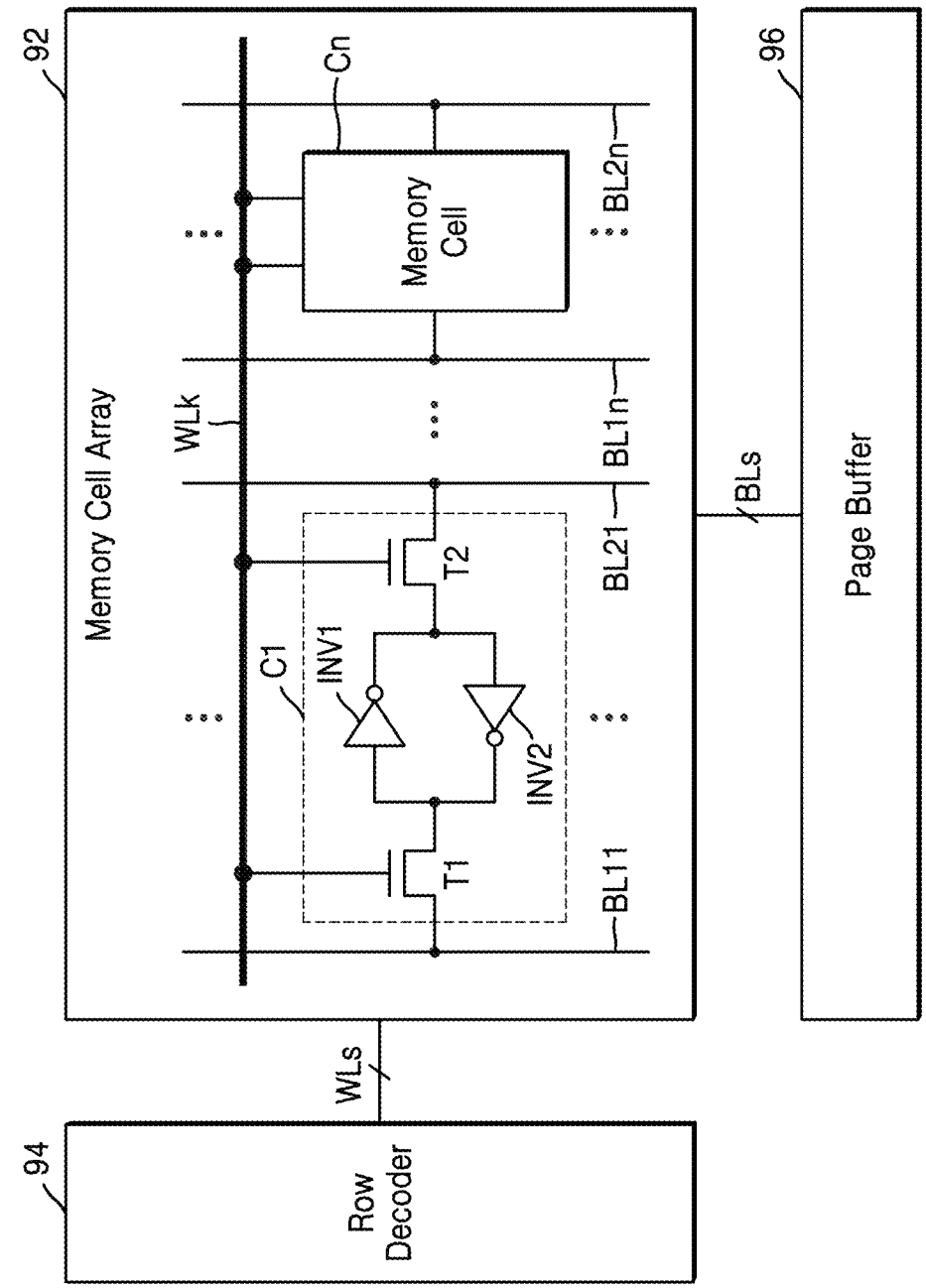
FIG. 9 is a block diagram of a memory device according to some example embodiments.
Figure 10:
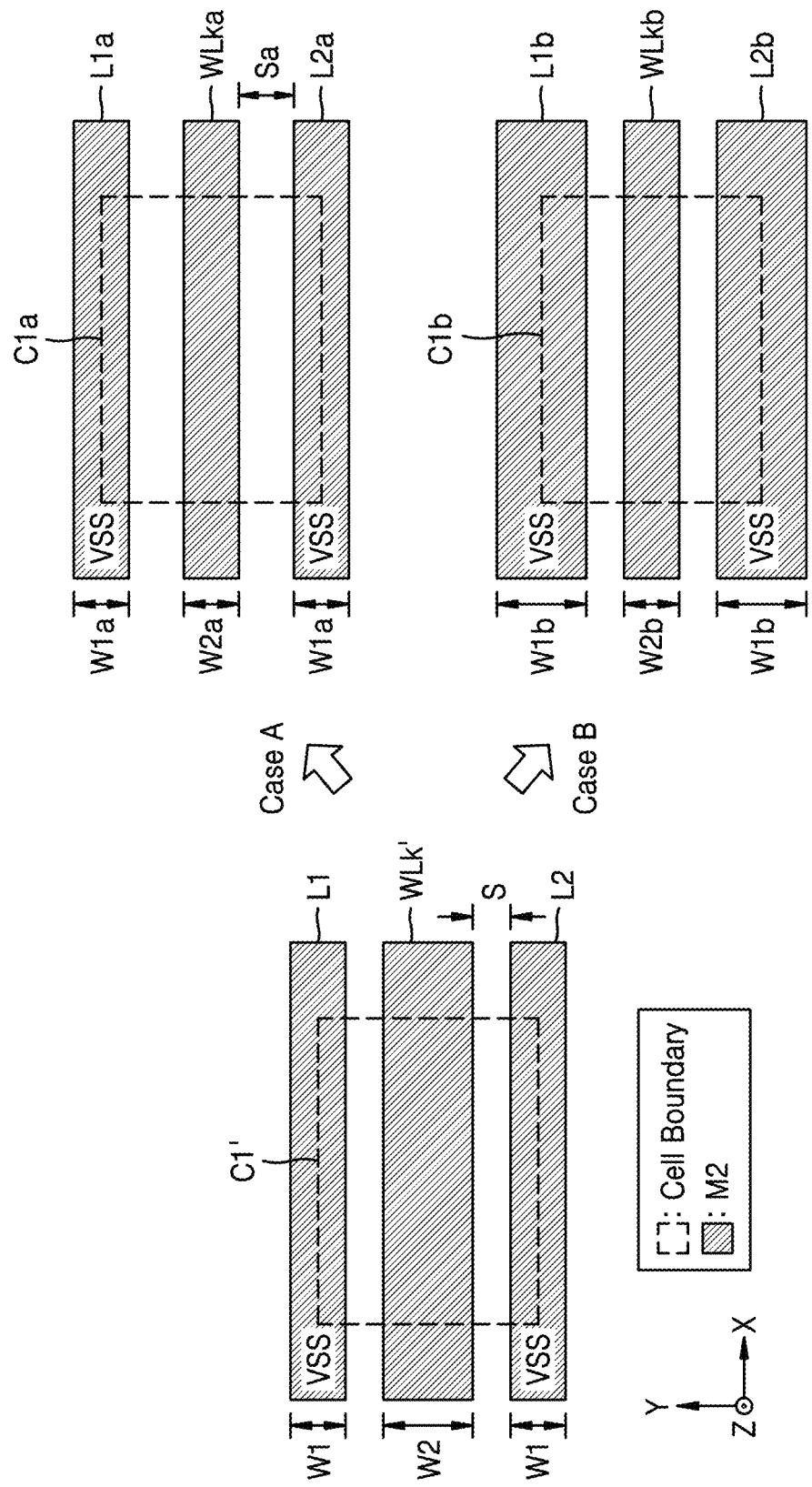
FIG. 10 is a diagram partially showing a layout of the memory device of FIG. 9, according to some example embodiments.

FIG. 9 is a block diagram of a memory device 90 according to some example embodiments, and FIG. 10 is a diagram partially showing a layout of the memory device 90 of FIG. 9, according to some example embodiments. In some example embodiments, the memory device 90 may be an example of the integrated circuit 10 of FIG. 1. A series of memory cells C1, . . . , Cn, extending in the X-axis direction and thus at least partially overlapping each other in the X-axis direction, may correspond to the plurality of unit circuits U1, . . . , Un of FIG. 1, where the memory cells C1, . . . , Cn are each configured to store at least one bit of data, and a plurality of word lines WLs in the memory device 90 may be implemented as multi-layer conducting lines, such that at least one multi-layer conducting line ML that is electrically connected to control electrodes of transistors included in the series of memory cells C1, . . . , Cn is at least a part of a word line WL configured to select one or more memory cells of the memory cells C1, . . . , Cn.

Referring to FIG. 9, the memory device 90 may include a memory cell array 92, a row decoder 94, and a page buffer 96. The memory device 90 may receive a command and address from outside, and may receive or output data. In some example embodiments, the memory device 90 may receive a command such as a write command and a read command, and an address corresponding to the command. The memory device 90 may receive data in response to a write command and may output data in response to a read command. The memory device 90 may be packaged as an independent memory device or may be included in a semiconductor package such as a system-on-chip or a processor.

The memory cell array 92 may include a plurality of memory cells. In some example embodiments, as shown in FIG. 9, the memory cell array 92 may include a series of memory cells C1, . . . , Cn that are disposed in a certain direction as static random access memory (SRAM) cells (n is 1 or greater integer). The first memory cell C2 may include a first inverter INV1 and a second inverter INV2 that are cross-connected, and a first transistor T1 and a second transistor T2 that connect the first inverter INV1 and the second inverter INV2 electrically to a first bit line pair BL11 and BL21 during a write operation and a read operation. Although FIG. 9 shows the SRAM cell as an example, it would be appreciated that the word lines including multi-layer conducting lines may be applied to memories different from the SRAM, e.g., flash memory, dynamic RAM (DRAM), resistive RAM (RRAM), phase-change RAM (PRAM), etc.

The memory cell array 92 may be connected to the row decoder 94 via the plurality of word lines WLs, and may be connected to the page buffer 96 via a plurality of bit lines BLs. The series of memory cells C1, . . . , Cn included in the memory cell array 92 may be connected to a k-th word line WLk among the plurality of word lines WLs, and the series of memory cells C1, . . . , Cn connected to one word line or data stored in the series of memory cells C1, . . . , Cn may be referred to as a page. As shown in FIG. 9, the k-th word line WLk including the multi-layer conducting line may be connected (e.g., electrically connected) to control electrodes (e.g., gate electrodes) of the first transistor T1 and the second transistor T2 included in the first memory cell C1. Similarly, the k-th word line WLk may be connected (e.g., electrically connected) to control electrodes of transistors included in the second through nth memory cells C2 . . . Cn. Accordingly, it will be understood that the multi-layer conducting line may be electrically connected to control electrodes of transistors included in the plurality of memory cells C1 . . . Cn, which may be unit circuits.

The row decoder 94 may activate the k-th word line WLk among the plurality of word lines WLs, in order to select a series of memory cells C1, . . . , Cn from among the plurality of memory cells included in the memory cell array 92. In some example embodiments, the row decoder 94 may activate the k-th word line WLk by increasing a voltage level of the k-th word line WLk. That is, the row decoder 94 may correspond to the control circuit 12 of FIG. 1. The page buffer 96 may provide the plurality of bit lines BLs with signals corresponding to data to be written in the selected series of memory cells C1, . . . , Cn, or may sense signals corresponding to data stored in the series of memory cells C1, . . . , Cn selected by the row decoder 94 from the plurality of bit lines BLs.

The k-th word line WLk including the multi-layer conducting line may have a reduced resistance as described above with reference to the accompanying drawings, and accordingly, a difference between time points at which the signals applied by the row decoder 94 to the k-th word line WLk, e.g., high level voltage (or low level voltage), reach the first memory cell C1 and the n-th memory cell Cn may be reduced, and accordingly, the writing speed and reading speed onto/from the memory device 90 may be improved. Also, due to the reduced resistance of the k-th word line WLk, the k-th word line WLk may have a width that is less than that of a case in which the word line does not include the multi-layer conducting line, and examples in which the k-th word line WLk has the reduced width will be described below with reference to FIG. 10.

Referring to the left in FIG. 10, a first line L1 and a second line L2, to which a negative supply voltage (VSS) (or ground voltage) is applied, on boundaries facing each other in the Y-axis direction from among boundaries of a first memory cell C1' may extend in the X-axis direction, and the k-th word line WLk' not including the multi-layer conducting line may extend between the first and second lines L1 and L2. In order to supply stabilized negative supply voltage (VSS) to a series of memory cells including the first memory cell C1', the first line L1 and the second line L2 providing the negative supply voltage (VSS) may be disposed as shown in FIG. 10. The first line L1 and the second line L2 may have a first width W1, and the k-th word line WLk' not including the multi-layer conducting line may have a second width W2. As described above, when the k-th word lines WLk' includes the multi-layer conducting line, the k-th word line WLk' may have a width less than the second width W2, and in FIG. 10, 'case A' and 'case B' are examples, in which the k-th word line WLk' include the multi-layer conducting line.

Referring to 'case A' of FIG. 10, a width W1a of a first line L1a and a second line L2a that supply the negative supply voltage (VSS) to a series of memory cells including a first memory cell C1a may be maintained (W1a=W1). However, a distance between a k-th word line WLka and the first line L1a may increase and a distance between the k-th word lines WLk1 and the second line L2a may increase due to a reduced width W2a of the k-th word line WLka (W2a<W2). In some example embodiments, a distance S of the k-th word line WLk' shown in the left side of FIG. 10 respectively from the first line L1 and the second line L2 may be equal to a minimum distance between patterns in the M2 layer, and a distance Sa of the k-th word line WLka from the first line L1a and the second line L2a in 'case A' of FIG. 10 may be greater than the minimum distance between patterns in the M2 layer. Accordingly, the capacitance generated by the k-th word line WLka with the first line L1a and the second line L2a may be reduced, and thus, a delay occurring on the k-th word line WLka may be further reduced.

Referring to 'case B' of FIG. 10, due to a reduced width W2b of the k-th word line WLka (W2b<W2), a width W1b of a first line L1n and a second line L2b providing a first memory cell C1b with the negative supply voltage VSS may increase (W1b>W1). Accordingly, resistances of the first line L1b and the second line L2b may be reduced, and accordingly, the negative supply voltage VSS may be provided reliably to a series of memory cells including the first memory cell C1b.

Figure 11:
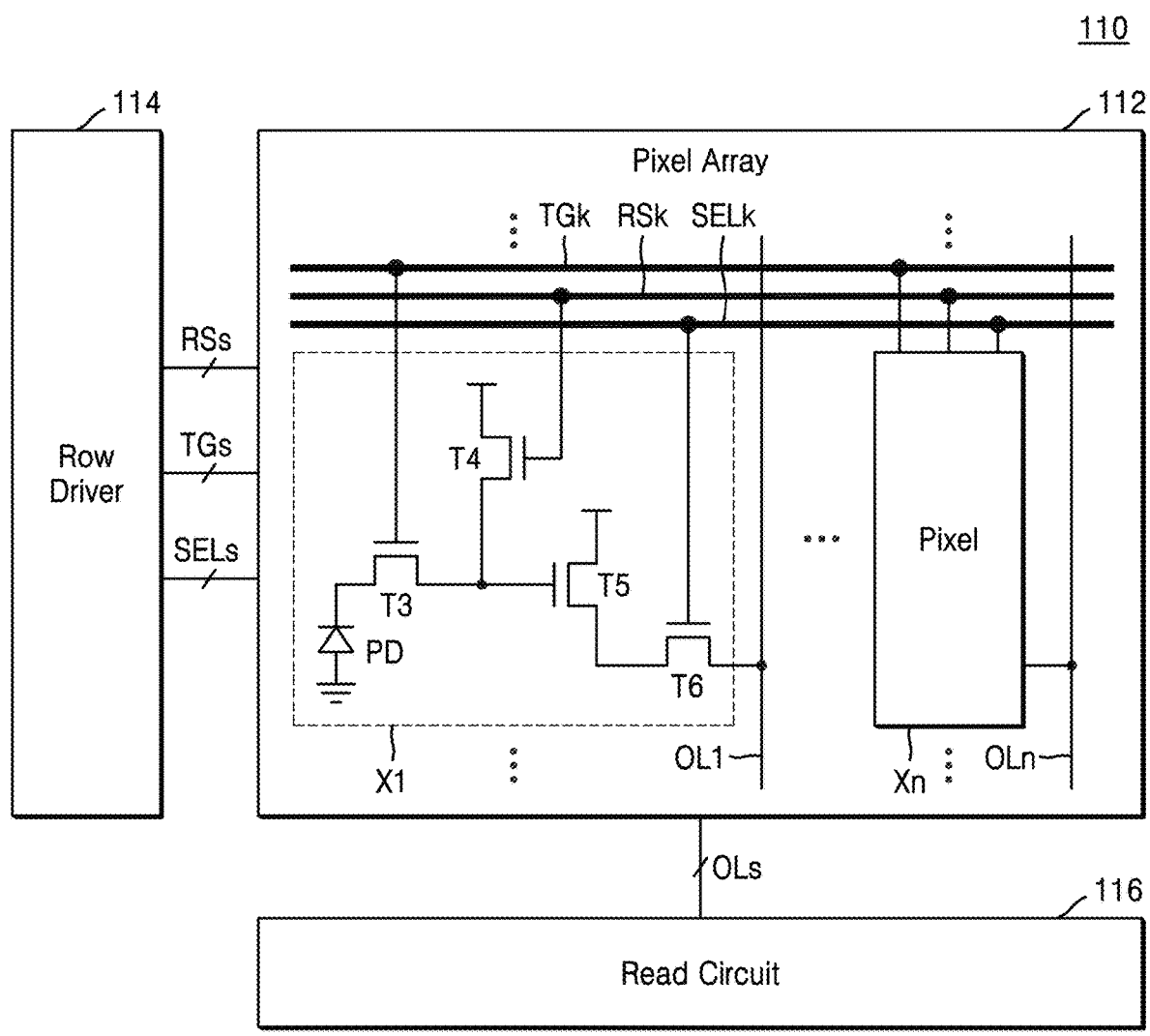
FIG. 11 is a block diagram of an image sensor according to some example embodiments.

FIG. 11 is a block diagram of an image sensor 110 according to some example embodiments. In some example embodiments, the image sensor 110 may be an example of the integrated circuit 10 of FIG. 1. A series of pixels X1, ..., Xn, extending in the X-axis direction and thus at least partially overlapping each other in the X-axis direction, may correspond to the plurality of unit circuits U1, ..., Un of FIG. 1, and at least some of control lines RSs, TGs, and SELs for controlling the plurality of pixels in the image sensor 110 may include multi-layer conducting lines, such that at least one multi-layer conducting line ML that is electrically connected to control electrodes of transistors included in the pixels X1, ..., Xn is at least a part of a control line configured to communicate control signals for controlling operations of the pixels X1, ..., Xn and thus the multi-layer conducting line may be configured to receive a control signal for controlling operations of the plurality of pixels X1, ..., Xn.

Referring to FIG. 11, the image sensor 110 may include a pixel array 112, a row driver 114, and a read circuit 116. The pixel array 112 may be connected to the row driver 114 via the plurality of control lines, that is, a plurality of reset lines RSs, a plurality of transfer lines TGs, and a plurality of selection lines SELs, and may be connected to the read circuit 116 via a plurality of output lines OLs. The row driver 114 may simultaneously or sequentially activate some of the plurality of reset lines RSs, the plurality of transfer lines TGs, and the plurality of selection lines SELs to control the plurality of pixels included in the pixel array 112, and the read circuit 116 may detect light intensity sensed by the pixel array 112 by sensing a voltage and/or current of the output lines OLs.

The pixel array 112 may include the plurality of pixels. In some example embodiments, the pixel array 112 may include a series of pixels X1, ..., Xn each having a 4-transistor (4T) structure as shown in FIG. 11 (n is 1 or greater integer). That is, the first pixel X1 may include four transistors T3 to T6 and a photo-detecting device PD. Although FIG. 11 shows the pixel having the 4T structure, it would be appreciated that the control lines including the multi-layer conducting lines may be applied to an image sensor including pixels of another structure, e.g., 6T structure. As shown in FIG. 11, a k-th transfer line TGk may be connected to a control electrode (or gate electrode) of a transfer transistor T3, a k-th reset line RSk may be connected to a control electrode of a reset transistor T5, and a k-th selection line SELk may be connected to a control electrode of a selection transistor T6. Accordingly, it will be understood that the multi-layer conducting line may be electrically connected to control electrodes of transistors included in the plurality of pixels X1 ... Xn, which may be unit circuits. The multi-layer conducting line ML that is electrically connected to control electrodes of transistors included in the plurality of pixels X1 ... Xn may be configured to receive a control signal for controlling operations of the plurality of pixels X1 ... Xn.

Since at least some of the plurality of control lines include multi-layer conducting lines, operations of the image sensor 110 may be improved. In some example embodiments, when the plurality of transfer lines TGs include the multi-layer conducting lines, a difference between a period, in which the first pixel X1 senses light, and a period, in which an n-th pixel Xn senses light, may be reduced, and accordingly, accuracy of an image generated by the image sensor 110 may be improved. Also, when the plurality of selection lines SELs include the multi-layer conducting lines, a difference between a time point at which the first pixel X1 outputs a signal to a first output line OL1 and a time point at which the n-th pixel Xn outputs a signal to an n-th output line OLn may be reduced, and accordingly, a reading speed of the read circuit 116 may increase and an image capturing speed of the image sensor 110 may also increase.

Figure 12:
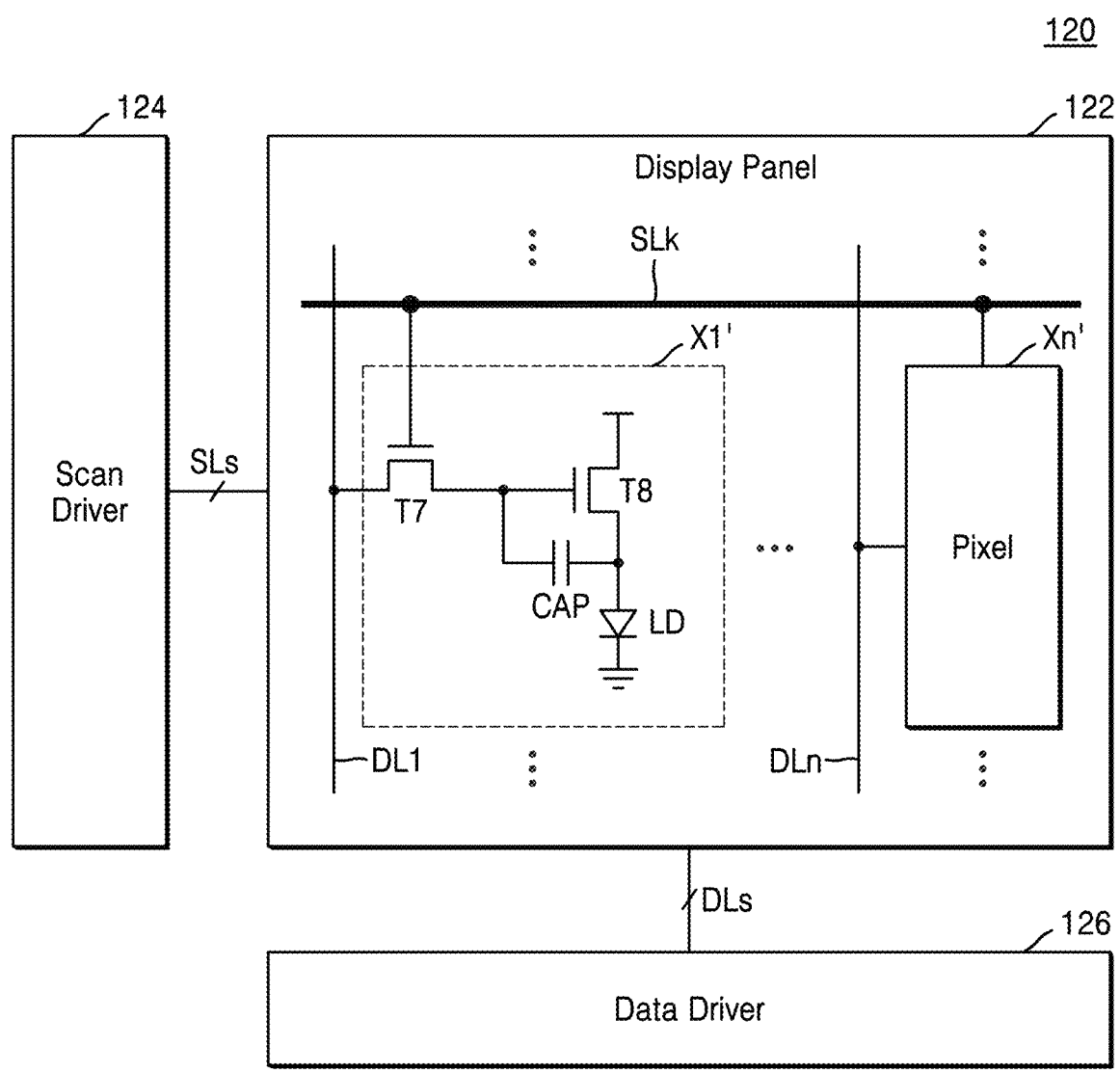
FIG. 12 is a block diagram of a display apparatus according to some example embodiments.

FIG. 12 is a block diagram of a display apparatus 120 according to some example embodiments. In some example embodiments, the display apparatus 120 (or display panel 122) may be an example of the integrated circuit 10 of FIG. 1. A series of pixels X1', ..., Xn', extending in the X-axis direction and thus at least partially overlapping each other in the X-axis direction, may correspond to the unit circuits U1, ..., Un of FIG. 1 and may each be configured to emit light, and a plurality of scan lines SLs for controlling the plurality of pixels in the display apparatus 120 may include multi-layer conducting lines. Accordingly, at least one multi-layer conducting line ML that is electrically connected to control electrodes of transistors included in the pixels X1', ..., Xn' is at least a part of a scan line SL configured to select one or more pixels of the pixels X1', ..., Xn'.

Referring to FIG. 12, the display apparatus 120 may include the display panel 122, a scan driver 124, and a data driver 126. The display panel 122 may be connected to the scan driver 124 via the plurality of scan lines SLs, and may be connected to the data driver 126 via a plurality of data lines DLs. The scan driver 124 may activate one of the plurality of scan lines SLs for selecting a series of pixels from among the plurality of pixels included in the display panel 122, and the data driver 126 may provide the plurality of data lines DLs with a voltage and/or a current according to an intensity of light that is to be emitted from the series of pixels that are selected by the scan driver 124.

The display panel 122 may include the plurality of pixels. In some example embodiments, the display panel 122 may include a series of pixels X1', ..., Xn' each including a light-emitting diode (LED) (n is 1 or greater integer). That is, a first pixel X1' may include two transistors T7 and T8, a capacitor CAP, and an LED LD. Although FIG. 12 shows the pixels including the LED, it would be appreciated that the plurality of scan lines SLs including the multi-layer conducting lines may be also applied to a display panel including other light-emitting elements than the LED. As shown in FIG. 12, a k-th scan line SLk may be connected to a control electrode (or a gate electrode) of the switching transistor T7. Accordingly, it will be understood that the multi-layer conducting line may be electrically connected to control electrodes of transistors included in the plurality of pixels X1' ... Xn', which may be unit circuits.

Since the plurality of scan lines SLs include the multi-layer conducting lines, operations of the display apparatus 120 may be improved. In some example embodiments, a difference between a time point of selecting the first pixels X1' and a time point of selecting the n-th pixel Xn' may be reduced, and accordingly, quality of an image output from the display panel 122 may be improved and a speed of updating images in the display panel 122 may increase.

Figure 13:
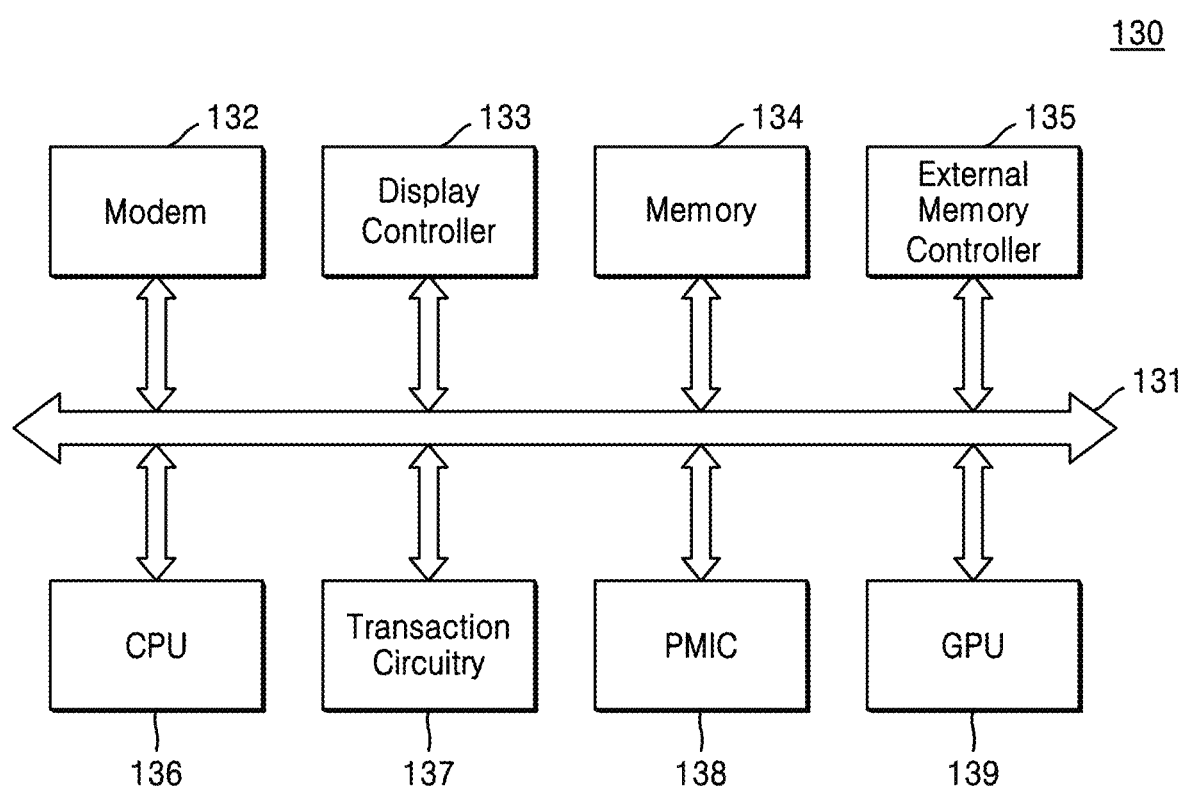
FIG. 13 is a block diagram of a system-on-chip (SoC) according to some example embodiments.

FIG. 13 is a block diagram of a system-on-chip (SoC) 130 according to some example embodiments. The SoC 130 may be an example of the integrated circuit 10 of FIG. 1, and may include a multi-layer conducting line according to some example embodiments. The SoC 130 implements complicated functional blocks such as an IP (intellectual property) performing various functions in one chip, and multi-layer conducting lines each including portions extending in two or more successive layers according to some example embodiments may be included in each functional block of the SoC 130. Accordingly, a delay occurring in wirings may be reduced while achieving high spatial efficiency, the SoC 130 may have a high integration and a high operating speed.

Referring to FIG. 13, the SoC 130 may include a modem 132, a display controller 133, a memory 134, an external memory controller 135, a central processing unit (CPU) 136, a transaction circuitry 137, a power management integrated circuit (PMIC) 138, and a graphics processing unit (GPU) 139, and the functional blocks in the SoC 130 may communicate with one another via a system bus 131. One or more of the elements included in the SoC 130, including the modem 132, display controller 133, memory 134, external memory controller 135, central processing unit (CPU) 136, transaction circuitry 137, power management integrated circuit (PMIC) 138, and graphics processing unit (GPU) 139, and the functional blocks in the SoC 130, may be implemented by and/or substituted with one or more instances of processing circuitry such as hardware including logic circuits; a hardware/software combination such as a processor executing software; or a combination thereof. For example, the SoC 130 more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. that is/are configured to implement the functionality of some or all of the elements of the SoC as shown in FIG. 14 and/or some or all of the functional blocks in the SoC.

The CPU 136 that controls overall operations of the SoC 130 may control operations of other functional blocks (e.g., 132, 133, 134, 135, 137, 138, and 139). The modem 132 may demodulate a signal received from outside of the SoC 130 or modulate a signal generated in the SoC 130, and then, may transmit the signal to outside. The external memory controller 135 may control an operation of transmitting/receiving data to/from an external memory device connected to the SoC 130. In some example embodiments, a program and/or data stored in the external memory device may be provided to the CPU 136 or the GPU 139 under the control of the external memory controller 135. The GPU 139 may execute program instructions regarding processing of graphics. The GPU 139 may receive graphic data via the external memory controller 135 or may transmit graphic data processed by the GPU 139 to outside of the SoC 130 via the external memory controller 135. Transaction circuitry 137 may monitor data transaction of each functional block, and the PMIC 138 may control electric power supplied to each functional block according to the control of the transaction circuitry 137. The display controller 133 controls a display (or display apparatus) on an outer portion of the SoC 130 to transfer the data generated in the SoC 130 to the display.

The memory 134 may include non-volatile memory such as electrically erasable programmable read-only memory (EEPROM), flash memory, phase change RAM (PRAM), resistance RAM (RRAM), nano floating gate memory (NFGM), polymer RAM (PoRAM), magnetic RAM (MRAM), ferroelectric RAM (FRAM), etc. or volatile memory such as dynamic RAM (DRAM), static RAM (SRAM), mobile DRAM, double data rate synchronous DRAM (DDR SDRAM), low power DDR (LPDDR) SDRAM, graphic DDR (GDDR) SDRAM, Rambus DRAM (RDRAM), etc. In some example embodiments, as described above with reference to FIG. 9, etc., a plurality of word lines for respectively selecting some of the plurality of memory cells included in the memory 134 may include multi-layer conducting lines.

While the inventive concepts have been particularly shown and described with reference to embodiments thereof, it will be understood that various changes in form and details may be made therein without departing from the spirit and scope of the following claims.

What is claimed is:
1. An integrated circuit, comprising:
a first wiring layer including a plurality of first patterns;
a first via layer including a plurality of first vias, the first via layer adjacent to the first wiring layer in a first direction; and
a multi-layer conducting line including a first portion and a second portion, the first portion extending in a second direction perpendicular to the first direction in the first wiring layer and the second portion extending in the second direction in the first via layer, wherein the first portion and the second portion are integrally formed with each other such that the first portion and the second portion are part of a single, uniform part, wherein the multi-layer conducting line is isolated from direct contact with the plurality of first patterns and the plurality of first vias.

2. The integrated circuit of claim 1, further comprising:
a second wiring layer including a plurality of second patterns, the second wiring layer adjacent to the first via layer in the first direction, wherein the multi-layer conducting line further includes a third portion in the second wiring layer, the third portion extending in the second direction by a length equal to a length of the first portion in the second direction.

3. The integrated circuit of claim 2, wherein
the first portion, the second portion, and the third portion are integrally formed with one another.

4. The integrated circuit of claim 2, wherein
the multi-layer conducting line further includes a barrier layer between the second portion and the third portion.

5. The integrated circuit of claim 2, further comprising:
a second via layer including a plurality of second vias, the second via layer adjacent to the second wiring layer in the first direction, wherein the multi-layer conducting line further includes a fourth portion in the second via layer, the fourth portion extending in the second direction.

6. The integrated circuit of claim 5, wherein
the first portion, the second portion, the third portion, and the fourth portion are integrally formed with one another.

7. The integrated circuit of claim 5, wherein
the multi-layer conducting line further includes a barrier layer between the second portion and the third portion.

8. The integrated circuit of claim 1, further comprising:
a second wiring layer including a plurality of second patterns, the second wiring layer adjacent to the first via layer in the first direction; and
an interlayer insulator between the multi-layer conducting line and the second wiring layer.

9. The integrated circuit of claim 1, wherein
the second portion has a width that is equal to or less than a width of the first portion.

10. The integrated circuit of claim 1, wherein
the second portion has a length that is equal to a length of the first portion.

11. The integrated circuit of claim 1, further comprising:
a plurality of unit circuits at least partially overlapping each other in the second direction, the plurality of unit circuits configured to operate in parallel with one another, wherein the multi-layer conducting line is electrically connected to control electrodes of transistors included in the plurality of unit circuits.

12. The integrated circuit of claim 1, wherein
the plurality of first patterns are isolated from direct contact with each other by at least a first distance, and
the multi-layer conducting line is isolated from direct contact with the plurality of first patterns by a second distance, the second distance being greater than the first distance.

13. The integrated circuit of claim 1, wherein
the multi-layer conducting line includes a same metal material in the first wiring layer and in the first via layer.

14. The integrated circuit of claim 13, further comprising:
a barrier layer configured to reduce diffusion of the same metal material at least partially in a surface of the multi-layer conducting line when the multi-layer conducting line is formed.

15. The integrated circuit of claim 1, further comprising:
a plurality of unit circuits disposed in the second direction and configured to operate in parallel with one another, wherein the multi-layer conducting line is configured to transfer a control signal for controlling the plurality of unit circuits simultaneously.

16. An integrated circuit, comprising:
a first wiring layer including a plurality of first patterns;
a first via layer including a plurality of first vias, the first via layer adjacent to the first wiring layer in a first direction; and
a multi-layer conducting line including a first portion, a second portion, and a first barrier layer, the first portion extending in a second direction perpendicular to the first direction in the first wiring layer, the second portion extending in the second direction in the first via layer, and the first barrier layer extending in the second direction between the first portion and the second portion, wherein the multi-layer conducting line is isolated from direct contact with the plurality of first patterns and the plurality of first vias.

17. The integrated circuit of claim 16, wherein
the first barrier layer is configured to reduce a material included in the first portion and/or a material included in the second portion from diffusing when the first portion and/or the second portion is formed.

18. The integrated circuit of claim 16, further comprising:
a second wiring layer including a plurality of second patterns, the second wiring layer adjacent to the first via layer in the first direction, wherein the multi-layer conducting line further includes
a third portion extending in the second direction in the second wiring layer by a length that is equal to a length of the first portion in the second direction, and
a second barrier layer extending in the second direction between the second portion and the third portion.

19. The integrated circuit of claim 18, wherein
the second barrier layer is configured to reduce a material included in the second portion and/or a material included in the third portion from diffusing, when the second portion and/or the third portion is formed.

20. The integrated circuit of claim 16, wherein
the second portion has a length that is equal to a length of the first portion.

21. The integrated circuit of claim 16, further comprising:
a plurality of unit circuits disposed in the second direction and configured to operate in parallel with one another, wherein the multi-layer conducting line is configured to transfer a control signal for controlling the plurality of unit circuits simultaneously.

22. An integrated circuit comprising:
a plurality of layers stacked in a first direction;
a plurality of unit circuits at least partially overlapping each other in a second direction that is perpendicular to the first direction, the plurality of unit circuits being configured to operate in parallel with one another;
control circuitry configured to generate a control signal to control the plurality of unit circuits; and
a multi-layer conducting line configured to transfer the control signal from the control circuitry to the plurality of unit circuits, wherein the multi-layer conducting line is integrally formed in a wiring layer and a via layer and extends in the second direction, the wiring layer and the via layer being adjacent to each other, the wiring layer including a plurality of first patterns, the via layer including a plurality of first vias, the multi-layer conducting line being isolated from direct contact with the plurality of first patterns and the plurality of first vias.

* * * * *